(12) United States Patent
Varadarajan

(10) Patent No.: US 10,832,904 B2
(45) Date of Patent: *Nov. 10, 2020

(54) REMOTE PLASMA BASED DEPOSITION OF OXYGEN DOPED SILICON CARBIDE FILMS

(71) Applicant: Novellus Systems, Inc., Fremont, CA (US)

(72) Inventor: Bhadri N. Varadarajan, Beaverton, OR (US)

(73) Assignee: Lam Research Corporation, Fremont, CA (US)

(*) Notice: Subject to any disclaimer, the term of this patent is extended or adjusted under 35 U.S.C. 154(b) by 78 days.

This patent is subject to a terminal disclaimer.

(21) Appl. No.: 15/696,045

(22) Filed: Sep. 5, 2017

(65) Prior Publication Data

US 2017/0365462 A1  Dec. 21, 2017

Related U.S. Application Data

(63) Continuation-in-part of application No. 13/494,836, filed on Jun. 12, 2012, now Pat. No. 10,211,310.

(Continued)

(51) Int. Cl.
*H01L 21/02* (2006.01)
*C23C 16/511* (2006.01)
(Continued)

(52) U.S. Cl.
CPC ...... *H01L 21/02126* (2013.01); *C23C 16/325* (2013.01); *C23C 16/452* (2013.01);
(Continued)

(58) Field of Classification Search
CPC ..... C23C 16/30; C23C 16/401; C23C 16/325; H01L 21/02186
See application file for complete search history.

(56) References Cited

U.S. PATENT DOCUMENTS 4,177,474 A   12/1979  Ovshinsky
4,532,150 A    7/1985  Endo et al.
(Continued)

FOREIGN PATENT DOCUMENTS

CA   868641 A    4/1971
CN   1714168 A  12/2005
(Continued)

OTHER PUBLICATIONS

G.E. Coates et. al. Principles of Organometallic Chemistry, Chapter 4 p. 121-122 1968.*
(Continued)

*Primary Examiner* — Brigitte A Paterson
(74) *Attorney, Agent, or Firm* — Weaver Austin Villeneuve & Sampson LLP

(57) ABSTRACT

Disclosed are methods and systems for providing oxygen doped silicon carbide. A layer of oxygen doped silicon carbide can be provided under process conditions that employ one or more silicon-containing precursors that have one or more silicon-hydrogen bonds and/or silicon-silicon bonds. The silicon-containing precursors may also have one or more silicon-oxygen bonds and/or silicon-carbon bonds. One or more radical species in a substantially low energy state can react with the silicon-containing precursors to form the oxygen doped silicon carbide film. The one or more radical species can be formed in a remote plasma source.

12 Claims, 8 Drawing Sheets

Related U.S. Application Data

(60) Provisional application No. 62/385,784, filed on Sep. 9, 2016.

(51) Int. Cl.

| | | |
|---|---|---|
| *C23C 16/32* | (2006.01) | |
| *C23C 16/505* | (2006.01) | |
| *C23C 16/455* | (2006.01) | |
| *H01L 21/768* | (2006.01) | |
| *C23C 16/50* | (2006.01) | |
| *H01L 29/49* | (2006.01) | |
| *C23C 16/452* | (2006.01) | |
| *H01L 21/28* | (2006.01) | |
| *H01L 23/532* | (2006.01) | |
| *H01L 23/522* | (2006.01) | |

(52) U.S. Cl.
CPC ........ *C23C 16/45525* (2013.01); *C23C 16/50* (2013.01); *C23C 16/505* (2013.01); *C23C 16/511* (2013.01); *H01L 21/02211* (2013.01); *H01L 21/02216* (2013.01); *H01L 21/02274* (2013.01); *H01L 21/76831* (2013.01); *H01L 21/76834* (2013.01); *H01L 29/4983* (2013.01); *H01L 29/4991* (2013.01); *H01L 21/28247* (2013.01); *H01L 23/5222* (2013.01); *H01L 23/5329* (2013.01); *H01L 23/53238* (2013.01); *H01L 2221/1047* (2013.01)

(56) References Cited

U.S. PATENT DOCUMENTS

| | | |
|---|---|---|
| 4,656,110 A | 4/1987 | Yamazaki |
| 4,783,368 A | 11/1988 | Yamamoto et al. |
| 4,895,789 A | 1/1990 | Motte et al. |
| 4,952,658 A | 8/1990 | Kalchauer et al. |
| 5,034,355 A | 7/1991 | Tani et al. |
| 5,108,965 A | 4/1992 | Tani et al. |
| 5,122,431 A | 6/1992 | Kodama et al. |
| 5,324,690 A | 6/1994 | Gelatos et al. |
| 5,447,816 A | 9/1995 | Kodama et al. |
| 5,464,699 A | 11/1995 | Baldi |
| 5,518,572 A | 5/1996 | Kinoshita et al. |
| 5,567,243 A | 10/1996 | Foster et al. |
| 5,654,208 A | 8/1997 | Harris et al. |
| 5,739,579 A | 4/1998 | Chiang et al. |
| 5,807,615 A | 9/1998 | Sindzingre et al. |
| 5,958,324 A | 9/1999 | Bujalski et al. |
| 6,045,877 A | 4/2000 | Gleason et al. |
| 6,100,587 A | 8/2000 | Merchant et al. |
| 6,150,719 A | 11/2000 | Saia et al. |
| 6,159,871 A | 12/2000 | Loboda et al. |
| 6,197,688 B1 | 3/2001 | Simpson |
| 6,242,686 B1 | 6/2001 | Kishimoto et al. |
| 6,262,445 B1 | 7/2001 | Swanson et al. |
| 6,316,167 B1 | 11/2001 | Angelopoulos et al. |
| 6,352,945 B1 | 3/2002 | Matsuki |
| 6,365,527 B1 | 4/2002 | Yang et al. |
| 6,383,299 B1 | 5/2002 | Yuda et al. |
| 6,383,898 B1 | 5/2002 | Kishimoto |
| 6,383,955 B1 | 5/2002 | Matsuki et al. |
| 6,395,150 B1 | 5/2002 | Van Cleemput et al. |
| 6,399,484 B1 | 6/2002 | Yamasaki et al. |
| 6,410,419 B1 | 6/2002 | Merchant et al. |
| 6,417,092 B1 | 7/2002 | Jain et al. |
| 6,424,044 B1 | 7/2002 | Han et al. |
| 6,432,846 B1 | 8/2002 | Matsuki |
| 6,448,186 B1 | 9/2002 | Olson et al. |
| 6,448,666 B1 | 9/2002 | Kudo et al. |
| 6,455,409 B1 | 9/2002 | Subramanian et al. |
| 6,465,366 B1 | 10/2002 | Nemani et al. |
| 6,465,372 B1 | 10/2002 | Xia et al. |
| 6,506,692 B2 | 1/2003 | Andideh |
| 6,576,345 B1 | 6/2003 | Van Cleemput et al. |
| 6,624,064 B1 | 9/2003 | Sahin et al. |
| 6,670,715 B2 | 12/2003 | Yang et al. |
| 6,764,958 B1 | 7/2004 | Nemani et al. |
| 6,767,836 B2 | 7/2004 | San et al. |
| 6,774,489 B2 | 8/2004 | Russell et al. |
| 6,790,767 B2 | 9/2004 | Lee |
| 6,790,788 B2 | 9/2004 | Li et al. |
| 6,846,391 B1 | 1/2005 | Papasouliotis et al. |
| 6,849,561 B1 | 2/2005 | Goundar |
| 6,851,384 B2 | 2/2005 | Yuda et al. |
| 6,855,645 B2 | 2/2005 | Tang et al. |
| 6,875,687 B1 | 4/2005 | Weidman et al. |
| 6,881,683 B2 | 4/2005 | Matsuki et al. |
| 6,890,850 B2 | 5/2005 | Lee et al. |
| 6,919,270 B2 | 7/2005 | Satoh et al. |
| 6,930,013 B2 | 8/2005 | Choi et al. |
| 6,935,553 B2 | 8/2005 | Suga et al. |
| 6,949,450 B2 | 9/2005 | Chiang et al. |
| 6,967,405 B1 | 11/2005 | Yu et al. |
| 6,991,959 B2 | 1/2006 | Goundar et al. |
| 7,064,088 B2 | 6/2006 | Hyodo et al. |
| 7,091,137 B2 | 8/2006 | Lee et al. |
| 7,115,534 B2 | 10/2006 | Nguyen et al. |
| 7,163,889 B2 | 1/2007 | Yu et al. |
| 7,163,896 B1 | 1/2007 | Zhu et al. |
| 7,200,460 B2 | 4/2007 | Campana et al. |
| 7,239,017 B1 | 7/2007 | Yu et al. |
| 7,253,125 B1 | 8/2007 | Bandyopadhyay et al. |
| 7,256,139 B2 | 8/2007 | Moghadam et al. |
| 7,282,438 B1 | 10/2007 | Yu et al. |
| 7,381,662 B1 | 6/2008 | Niu et al. |
| 7,420,275 B1 | 9/2008 | Yu et al. |
| 7,468,290 B2 | 12/2008 | Lukas et al. |
| 7,524,735 B1 | 4/2009 | Gauri et al. |
| 7,573,061 B1 | 8/2009 | Yu et al. |
| 7,622,400 B1 | 11/2009 | Fox et al. |
| 7,662,355 B2 | 2/2010 | Kamisako et al. |
| 7,709,063 B2 | 5/2010 | Yuda et al. |
| 7,736,728 B2 | 6/2010 | Loboda et al. |
| 7,842,604 B1 | 11/2010 | Yu et al. |
| 7,915,166 B1 | 3/2011 | Yu et al. |
| 7,923,385 B2 | 4/2011 | Wu et al. |
| 7,968,436 B1 | 6/2011 | Yu et al. |
| 8,021,992 B2 | 9/2011 | Liou et al. |
| 8,053,372 B1 | 11/2011 | Greer et al. |
| 8,084,339 B2 | 12/2011 | Antonelli et al. |
| 8,124,522 B1 | 2/2012 | Wu et al. |
| 8,168,268 B2 | 5/2012 | Ovshinsky |
| 8,173,537 B1 | 5/2012 | Chattopadhyay et al. |
| 8,178,168 B2 | 5/2012 | O'Neill et al. |
| 8,178,443 B2 | 5/2012 | Rangarajan et al. |
| 8,217,513 B2 | 7/2012 | Antonelli et al. |
| 8,247,332 B2 | 8/2012 | Rangarajan et al. |
| 8,669,181 B1 | 3/2014 | Yu et al. |
| 8,846,525 B2 | 9/2014 | Rangarajan et al. |
| 8,864,935 B2 | 10/2014 | Fair et al. |
| 8,916,022 B1 | 12/2014 | Caron |
| 8,927,442 B1 | 1/2015 | Angyal et al. |
| 9,234,276 B2 | 1/2016 | Varadarajan |
| 9,337,068 B2 | 5/2016 | Antonelli et al. |
| 9,371,579 B2 | 6/2016 | Varadarajan et al. |
| 9,391,086 B2 | 7/2016 | Soda et al. |
| 9,591,738 B2 | 3/2017 | Qiu et al. |
| 9,837,270 B1 | 12/2017 | Varadarajan et al. |
| 10,002,787 B2 | 6/2018 | Yu et al. |
| 10,211,310 B2 | 2/2019 | Varadarajan et al. |
| 10,297,442 B2 | 5/2019 | Varadarajan et al. |
| 10,325,773 B2 | 6/2019 | Varadarajan et al. |
| 10,472,714 B2 | 11/2019 | Varadarajan |
| 10,580,690 B2 | 3/2020 | Yu et al. |
| 2001/0021491 A1 | 9/2001 | Chen et al. |
| 2002/0000202 A1 | 1/2002 | Yuda et al. |
| 2002/0012876 A1 | 1/2002 | Angelopoulos et al. |
| 2002/0016085 A1 | 2/2002 | Huang et al. |
| 2002/0019148 A1 | 2/2002 | Hawryluk et al. |
| 2002/0024117 A1 | 2/2002 | Russell et al. |
| 2002/0039625 A1 | 4/2002 | Powell et al. |
| 2002/0106891 A1 | 8/2002 | Kim et al. |
| 2002/0132101 A1 | 9/2002 | Fonash et al. |

(56) References Cited

U.S. PATENT DOCUMENTS

| | | |
|---|---|---|
| 2003/0001275 A1 | 1/2003 | Sambucetti et al. |
| 2003/0008528 A1 | 1/2003 | Xia et al. |
| 2003/0036215 A1 | 2/2003 | Reid |
| 2003/0049460 A1 | 3/2003 | O'Neill et al. |
| 2003/0057553 A1 | 3/2003 | DelaRosa et al. |
| 2003/0064154 A1* | 4/2003 | Laxman ............... C07F 7/1896 427/255.28 |
| 2003/0068881 A1 | 4/2003 | Xia et al. |
| 2003/0082296 A1 | 5/2003 | Elers et al. |
| 2003/0089992 A1 | 5/2003 | Rathi et al. |
| 2003/0139035 A1 | 7/2003 | Yim et al. |
| 2003/0154141 A1 | 8/2003 | Capazario et al. |
| 2003/0162033 A1 | 8/2003 | Johnson et al. |
| 2003/0176030 A1 | 9/2003 | Tsuji et al. |
| 2003/0194496 A1 | 10/2003 | Xu et al. |
| 2003/0232150 A1 | 12/2003 | Arnold et al. |
| 2003/0232514 A1 | 12/2003 | Kim et al. |
| 2004/0067308 A1 | 4/2004 | Zheng et al. |
| 2004/0084680 A1 | 5/2004 | Ruelke et al. |
| 2004/0084774 A1 | 5/2004 | Li et al. |
| 2004/0089924 A1 | 5/2004 | Yuasa et al. |
| 2004/0113279 A1 | 6/2004 | Chen et al. |
| 2004/0115876 A1 | 6/2004 | Goundar et al. |
| 2004/0115954 A1 | 6/2004 | Todd |
| 2004/0121085 A1 | 6/2004 | Wang et al. |
| 2004/0124531 A1 | 7/2004 | Venkatraman et al. |
| 2004/0161535 A1 | 8/2004 | Goundar et al. |
| 2004/0178169 A1 | 9/2004 | Desphande et al. |
| 2004/0194706 A1 | 10/2004 | Wang et al. |
| 2004/0207084 A1 | 10/2004 | Hedrick et al. |
| 2004/0232552 A1 | 11/2004 | Wang et al. |
| 2004/0253777 A1 | 12/2004 | Miyoshi et al. |
| 2005/0014361 A1 | 1/2005 | Nguyen et al. |
| 2005/0042889 A1 | 2/2005 | Lee et al. |
| 2005/0100682 A1 | 5/2005 | Fukiage et al. |
| 2005/0202685 A1 | 9/2005 | Huang et al. |
| 2005/0230831 A1 | 10/2005 | Clevenger et al. |
| 2005/0233555 A1 | 10/2005 | Rajagopalan et al. |
| 2005/0236711 A1 | 10/2005 | Wang et al. |
| 2005/0245071 A1 | 11/2005 | Wu et al. |
| 2005/0255714 A1 | 11/2005 | Iyer et al. |
| 2005/0277302 A1 | 12/2005 | Nguyen et al. |
| 2005/0287790 A1 | 12/2005 | Owada et al. |
| 2005/0287811 A1 | 12/2005 | Inukai |
| 2006/0014384 A1 | 1/2006 | Lee et al. |
| 2006/0014399 A1 | 1/2006 | Joe |
| 2006/0019486 A1 | 1/2006 | Yu et al. |
| 2006/0040507 A1 | 2/2006 | Mak et al. |
| 2006/0046520 A1 | 3/2006 | Padhi et al. |
| 2006/0091559 A1 | 5/2006 | Nguyen et al. |
| 2006/0110931 A1 | 5/2006 | Fukazawa et al. |
| 2006/0160376 A1 | 7/2006 | Padhi et al. |
| 2006/0216916 A1 | 9/2006 | Tsai et al. |
| 2006/0252273 A1 | 11/2006 | Lakshmanan et al. |
| 2006/0273319 A1 | 12/2006 | Dairiki et al. |
| 2007/0004204 A1 | 1/2007 | Fukazawa et al. |
| 2007/0032054 A1 | 2/2007 | Ramaswamy et al. |
| 2007/0032095 A1 | 2/2007 | Ramaswamy et al. |
| 2007/0141812 A1 | 6/2007 | Zagwijn et al. |
| 2007/0166546 A1 | 7/2007 | Ichikawa et al. |
| 2007/0173071 A1 | 7/2007 | Afzali-Ardakani et al. |
| 2007/0190266 A1 | 8/2007 | Fu |
| 2007/0232071 A1 | 10/2007 | Balseanu et al. |
| 2007/0264839 A1 | 11/2007 | Van Gompel et al. |
| 2007/0281496 A1 | 12/2007 | Ingle et al. |
| 2007/0281497 A1 | 12/2007 | Liu et al. |
| 2008/0050933 A1 | 2/2008 | Ozaki et al. |
| 2008/0063809 A1 | 3/2008 | Lee et al. |
| 2008/0064173 A1* | 3/2008 | Hung ............... H01L 21/823807 438/299 |
| 2008/0070396 A1 | 3/2008 | Budrevich et al. |
| 2008/0099754 A1 | 5/2008 | Enicks |
| 2008/0122103 A1 | 5/2008 | Bonilla et al. |
| 2008/0128907 A1 | 6/2008 | Yang et al. |
| 2008/0156264 A1 | 7/2008 | Fair et al. |
| 2008/0173984 A1 | 7/2008 | Lin et al. |
| 2008/0178805 A1 | 7/2008 | Paterson et al. |
| 2008/0217746 A1 | 9/2008 | Morita et al. |
| 2008/0233366 A1 | 9/2008 | Edelstein et al. |
| 2008/0254641 A1 | 10/2008 | Kobayashi et al. |
| 2008/0277765 A1 | 11/2008 | Lane et al. |
| 2009/0017227 A1 | 1/2009 | Fu et al. |
| 2009/0017640 A1 | 1/2009 | Huh et al. |
| 2009/0042402 A1 | 2/2009 | Morioka |
| 2009/0082240 A1* | 3/2009 | Nukui ............... G03F 7/423 510/176 |
| 2009/0215282 A1 | 8/2009 | Moore et al. |
| 2009/0218699 A1* | 9/2009 | Torres ............... H01L 21/76807 257/774 |
| 2009/0258487 A1 | 10/2009 | Lin et al. |
| 2009/0264277 A1 | 10/2009 | Raj et al. |
| 2009/0294925 A1 | 12/2009 | Lin et al. |
| 2009/0325364 A1 | 12/2009 | Sasagawa et al. |
| 2010/0075077 A1 | 3/2010 | Bicker et al. |
| 2010/0081293 A1* | 4/2010 | Mallick ............... C23C 16/325 438/794 |
| 2010/0181654 A1 | 7/2010 | Fujiwara et al. |
| 2010/0207274 A1* | 8/2010 | Hayashi ............... H01L 21/0273 257/751 |
| 2010/0255667 A1 | 10/2010 | Seino et al. |
| 2010/0308463 A1 | 12/2010 | Yu et al. |
| 2010/0317198 A1 | 12/2010 | Antonelli et al. |
| 2011/0027957 A1 | 2/2011 | Berry |
| 2011/0045676 A1 | 2/2011 | Park et al. |
| 2011/0074044 A1 | 3/2011 | Lin et al. |
| 2011/0109148 A1 | 5/2011 | Monyak et al. |
| 2011/0111533 A1 | 5/2011 | Varadarajan et al. |
| 2011/0111590 A1 | 5/2011 | Edelstein et al. |
| 2011/0114994 A1 | 5/2011 | Mandlik et al. |
| 2011/0117678 A1 | 5/2011 | Varadarajan et al. |
| 2011/0135557 A1 | 6/2011 | Rangarajan et al. |
| 2011/0146568 A1 | 6/2011 | Haukka et al. |
| 2011/0180866 A1 | 7/2011 | Matsuda et al. |
| 2011/0193230 A1 | 8/2011 | Nogami et al. |
| 2011/0204492 A1 | 8/2011 | Xie et al. |
| 2011/0236594 A1 | 9/2011 | Haverkamp et al. |
| 2012/0009802 A1 | 1/2012 | LaVoie et al. |
| 2012/0077349 A1 | 3/2012 | Li et al. |
| 2012/0122302 A1 | 5/2012 | Weidman et al. |
| 2012/0142172 A1 | 6/2012 | Fox et al. |
| 2012/0241089 A1 | 9/2012 | Dielmann et al. |
| 2012/0329287 A1 | 12/2012 | Gates et al. |
| 2013/0008378 A1 | 1/2013 | Antonelli et al. |
| 2013/0043514 A1 | 2/2013 | Grill et al. |
| 2013/0056818 A1 | 3/2013 | Lino et al. |
| 2013/0075455 A1 | 3/2013 | Shimizu |
| 2013/0084711 A1 | 4/2013 | Liang et al. |
| 2013/0119406 A1 | 5/2013 | Notsu et al. |
| 2013/0129940 A1* | 5/2013 | Xiao ............... C07F 7/025 427/578 |
| 2013/0157466 A1 | 6/2013 | Fox et al. |
| 2013/0242493 A1 | 9/2013 | Shenoy et al. |
| 2013/0298942 A1 | 11/2013 | Ren et al. |
| 2013/0319290 A1 | 12/2013 | Xiao et al. |
| 2013/0330932 A1 | 12/2013 | Rangarajan et al. |
| 2013/0330935 A1 | 12/2013 | Varadarajan |
| 2014/0132466 A1 | 5/2014 | Inoue et al. |
| 2014/0175617 A1 | 6/2014 | Antonelli et al. |
| 2014/0191365 A1 | 7/2014 | Barabash et al. |
| 2014/0197470 A1 | 7/2014 | Lee et al. |
| 2014/0264780 A1 | 9/2014 | Yim et al. |
| 2014/0264925 A1 | 9/2014 | Chen |
| 2014/0302690 A1 | 10/2014 | Underwood et al. |
| 2014/0356549 A1 | 12/2014 | Varadarajan |
| 2015/0016085 A1 | 1/2015 | Natsumeda et al. |
| 2015/0118394 A1 | 4/2015 | Varadarajan et al. |
| 2015/0179466 A1 | 6/2015 | Takayama et al. |
| 2015/0214015 A1 | 7/2015 | Kikuchi et al. |
| 2015/0303056 A1 | 10/2015 | Varadarajan et al. |
| 2016/0020089 A1 | 1/2016 | Thadani et al. |
| 2016/0090649 A1 | 3/2016 | Varadarajan |
| 2016/0268286 A1 | 9/2016 | Tamura |
| 2016/0276140 A1 | 9/2016 | Varadarajan et al. |
| 2016/0284615 A1 | 9/2016 | Kitajima et al. |

(56) References Cited

U.S. PATENT DOCUMENTS

| | | | |
|---|---|---|---|
| 2016/0314964 | A1 | 10/2016 | Tang et al. |
| 2016/0358804 | A1 | 12/2016 | Kulshreshtha et al. |
| 2017/0140924 | A1 | 5/2017 | Suzuki et al. |
| 2017/0365462 | A1 | 12/2017 | Varadarajan et al. |
| 2018/0033614 | A1 | 2/2018 | Chandra et al. |
| 2018/0096842 | A1 | 4/2018 | Varadarajan |
| 2018/0144977 | A1 | 5/2018 | Yu et al. |
| 2018/0202042 | A1 | 7/2018 | Fafard et al. |
| 2018/0240664 | A9 | 8/2018 | Varadarajan et al. |
| 2018/0330939 | A1 | 11/2018 | Pore |
| 2018/0330945 | A1 | 11/2018 | Varadarajan et al. |
| 2018/0330985 | A1 | 11/2018 | Yu et al. |
| 2018/0347035 | A1 | 12/2018 | Weimer et al. |
| 2019/0181004 | A1 | 6/2019 | Tang et al. |
| 2019/0259604 | A1 | 8/2019 | Varadarajan et al. |
| 2019/0382885 | A1 | 12/2019 | Varadarajan et al. |
| 2020/0027725 | A1 | 1/2020 | Weimer et al. |

FOREIGN PATENT DOCUMENTS

| | | | |
|---|---|---|---|
| CN | 1735945 | A | 2/2006 |
| CN | 101017834 | A | 8/2007 |
| CN | 101065834 | A | 10/2007 |
| CN | 101111930 | A | 1/2008 |
| CN | 101536191 | A | 9/2009 |
| CN | 102171796 | A | 8/2011 |
| CN | 102187450 | A | 9/2011 |
| CN | 102468434 | A | 5/2012 |
| CN | 102652353 | A | 8/2012 |
| CN | 102892922 | A | 1/2013 |
| EP | 1 172 845 | A2 | 1/2002 |
| EP | 1 186 685 | A2 | 3/2002 |
| JP | 10-092742 | A | 4/1998 |
| JP | 2001-160547 | | 6/2001 |
| JP | 2002-176100 | | 6/2002 |
| JP | 2002-217189 | | 8/2002 |
| JP | 2004-247725 | | 9/2004 |
| JP | 2004-320005 | A | 11/2004 |
| JP | 2005-051096 | A | 2/2005 |
| JP | 2007-158000 | | 6/2007 |
| JP | 2008-529296 | | 7/2008 |
| KR | 10-2006-0134964 | | 12/2006 |
| KR | 10-2009-0121361 | | 11/2009 |
| KR | 2011-0063386 | | 6/2011 |
| KR | 10-1334640 | B1 | 11/2013 |
| TW | 261689 | B | 11/1995 |
| TW | 476807 | B | 2/2002 |
| TW | 535253 | B | 6/2003 |
| TW | 200405437 | | 4/2004 |
| TW | 200600984 | | 1/2006 |
| TW | 200803988 | | 1/2008 |
| TW | 200839884 | | 10/2008 |
| TW | 200903635 | A | 1/2009 |
| TW | 200908138 | | 2/2009 |
| TW | 201124553 | A | 7/2011 |
| TW | 201214512 | A1 | 4/2012 |
| TW | 201214563 | A | 4/2012 |
| TW | 201240012 | A1 | 10/2012 |
| TW | 201405659 | A | 2/2014 |
| WO | WO 2007/116492 | | 10/2007 |
| WO | WO 2011/109148 | A2 | 9/2011 |

OTHER PUBLICATIONS

U.S. Office Action dated Dec. 19, 2014 issued in U.S. Appl. No. 13/907,699.
U.S. Final Office Action dated May 14, 2015 issued in U.S. Appl. No. 13/907,699.
U.S. Advisory Action and Examiner Initiated Interview Summary dated Aug. 12, 2015 issued in U.S. Appl. No. 13/907,699.
U.S. Notice of Allowance dated Sep. 10, 2015 issued in U.S. Appl. No. 13/907,699.
U.S. Office Action dated Feb. 5, 2018 issued in U.S. Appl. No. 14/961,637.
U.S. Final Office Action dated Aug. 28, 2018 issued in U.S. Appl. No. 14/961,637.
U.S. Office Action dated Jan. 29, 2019 issued in U.S. Appl. No. 14/961,637.
U.S. Office Action dated Sep. 15, 2015 issued in U.S. Appl. No. 14/062,648.
U.S. Notice of Allowance dated Feb. 19, 2016 issued in U.S. Appl. No. 14/062,648.
U.S. Office Action dated Nov. 16, 2018 issued in U.S. Appl. No. 15/169,530.
U.S. Final Office Action dated Mar. 5, 2019 issued in U.S. Appl. No. 15/169,530.
U.S. Office Action dated Nov. 2, 2015 issued in U.S. Appl. No. 14/616,435.
U.S. Final Office Action dated Mar. 10, 2016 issued in U.S. Appl. No. 14/616,435.
U.S. Office Action dated Jul. 8, 2016 issued in U.S. Appl. No. 14/616,435.
U.S. Final Office Action dated Feb. 22, 2017 issued in U.S. Appl. No. 14/616,435.
U.S. Examiner's Answer to the Appeal brief [filed May 19, 2017] before the Patent Trial and Appeal Board dated Sep. 22, 2017 issued in U.S. Appl. No. 14/616,435.
U.S. Notice of Allowance dated Feb. 4, 2019 issued in U.S. Appl. No. 14/616,435.
U.S. Office Action dated Sep. 12, 2016 issued in U.S. Appl. No. 14/692,627.
U.S. Final Office Action, dated May 19, 2017, issued in U.S. Appl. No. 14/692,627.
U.S. Office Action dated Nov. 8, 2017 issued in U.S. Appl. No. 14/692,627.
U.S. Final Office Action dated May 16, 2018 issued in U.S. Appl. No. 14/692,627.
U.S. Office Action dated Dec. 29, 2017 issued in U.S. Appl. No. 15/283,159.
U.S. Office Action dated Aug. 29, 2018 issued in U.S. Appl. No. 15/283,159.
U.S. Notice of Allowance dated Jan. 7, 2019 issued in U.S. Appl. No. 15/283,159.
U.S. Notice of Allowance dated Feb. 7, 2018 issued in U.S. Appl. No. 15/408,291.
U.S. Office Action dated Jul. 28, 2017 issued in U.S. Appl. No. 15/408,291.
U.S. Office Action dated Jul. 7, 2017 issued in U.S. Appl. No. 15/382,137.
U.S. Notice of Allowance dated Sep. 22, 2017 issued in U.S. Appl. No. 15/382,137.
U.S. Office Action dated Feb. 24, 2005 issued in U.S. Appl. No. 10/670,660.
U.S. Notice of Allowance dated Sep. 11, 2006 issued in U.S. Appl. No. 11/234,808.
U.S. Office Action dated May 3, 2006 issued in U.S. Appl. No. 10/915,117.
U.S. Final Office Action dated Sep. 7, 2006 issued in U.S. Appl. No. 10/915,117.
U.S. Office Action dated Dec. 11, 2006 issued in U.S. Appl. No. 10/915,117.
U.S. Notice of Allowance dated Feb. 26, 2007 issued in U.S. Appl. No. 10/915,117.
U.S. Office Action dated May 1, 2008 issued in U.S. Appl. No. 11/373,847.
U.S. Notice of Allowance and Allowed Claims dated Jul. 1, 2008 issued in U.S. Appl. No. 11/373,847.
U.S. Office Action dated Apr. 10, 2009 issued in U.S. Appl. No. 11/805,356.
U.S. Final Office Action dated Oct. 13, 2009 issued in U.S. Appl. No. 11/805,356.
U.S. Office Action dated Apr. 8, 2010 issued in U.S. Appl. No. 11/805,356.
U.S. Notice of Allowance and Allowed Claims dated Jul. 26, 2010 issued in U.S. Appl. No. 11/805,356.

(56) References Cited

OTHER PUBLICATIONS

U.S. Office Action dated Sep. 6, 2006 issued in U.S. Appl. No. 10/869,474.
U.S. Office Action dated Feb. 9, 2007 issued in U.S. Appl. No. 10/869,474.
U.S. Final Office Action dated Jun. 28, 2007 issued in U.S. Appl. No. 10/869,474.
U.S. Notice of Allowance dated Jul. 26, 2007 issued in U.S. Appl. No. 10/869,474.
U.S. Office Action dated Mar. 17, 2008 issued in U.S. Appl. No. 11/893,490.
U.S. Office Action dated Aug. 8, 2008 issued in U.S. Appl. No. 11/893,490.
U.S. Office Action (Ex Parte Quayle) dated Jan. 27, 2009 issued in U.S. Appl. No. 11/893,490.
U.S. Notice of Allowance dated May 4, 2009 issued in U.S. Appl. No. 11/893,490.
U.S. Office Action dated Oct. 15, 2010 issued in U.S. Appl. No. 12/497,322.
U.S. Notice of Allowance and Allowed Claims dated Mar. 11, 2011 issued in U.S. Appl. No. 12/497,322.
U.S. Office Action dated Nov. 20, 2009 issued in U.S. Appl. No. 11/710,652.
U.S. Final Office Action dated Apr. 15, 2010 issued in U.S. Appl. No. 11/710,652.
U.S. Office Action dated Aug. 5, 2010 issued in U.S. Appl. No. 11/710,652.
U.S. Notice of Allowance and Allowed Claims dated Nov. 24, 2010 issued in U.S. Appl. No. 11/710,652.
U.S. Office Action dated Jul. 9, 2013 issued in U.S. Appl. No. 11/710,652.
U.S. Notice of Allowance dated Oct. 25, 2013 issued in U.S. Appl. No. 11/710,652.
U.S. Office Action dated Dec. 31, 2008 issued in U.S. Appl. No. 11/693,617.
U.S. Office Action dated Oct. 7, 2009 issued in U.S. Appl. No. 11/693,617.
U.S. Office Action dated Jun. 10, 2010 issued in U.S. Appl. No. 11/693,617.
U.S. Final Office Action dated Jan. 20, 2011 issued in U.S. Appl. No. 11/693,617.
U.S. Office Action dated Sep. 16, 2011 issued in U.S. Appl. No. 11/693,617.
U.S. Notice of Allowance dated Jan. 9, 2012 issued in U.S. Appl. No. 11/693,617.
U.S. Office Action dated Jan. 12, 2011 issued in U.S. Appl. No. 12/082,496.
U.S. Final Office Action dated Aug. 4, 2011 issued in U.S. Appl. No. 12/082,496.
U.S. Notice of Allowance dated Oct. 26, 2011 issued in U.S. Appl. No. 12/082,496.
U.S. Notice of Allowance dated Apr. 10, 2012 issued in U.S. Appl. No. 12/631,691.
U.S. Office Action dated Feb. 7, 2014 issued in U.S. Appl. No. 13/967,832.
U.S. Notice of Allowance dated May 30, 2014 issued in U.S. Appl. No. 13/967,832.
U.S. Notice of Allowance dated Sep. 5, 2014 issued in U.S. Appl. No. 13/967,832.
U.S. Office Action dated Sep. 29, 2015 issued in U.S. Appl. No. 14/105,026.
U.S. Notice of Allowance dated Jan. 29, 2016 issued in U.S. Appl. No. 14/105,026.
U.S. Office Action dated Feb. 7, 2014 issued in U.S. Appl. No. 13/494,836.
U.S. Final Office Action dated Aug. 21, 2014 issued in U.S. Appl. No. 13/494,836.
U.S. Office Action dated May 5, 2015 issued in U.S. Appl. No. 13/494,836.
U.S. Final Office Action dated Nov. 16, 2015 issued in U.S. Appl. No. 13/494,836.
U.S. Office Action dated Mar. 10, 2016 issued in U.S. Appl. No. 13/494,836.
U.S. Final Office Action dated Jul. 11, 2016 issued in U.S. Appl. No. 13/494,836.
U.S. Office Action dated Jan. 9, 2017 issued in U.S. Appl. No. 13/494,836.
U.S. Examiner's Answer to the Appeal brief [filed Apr. 28, 2017] before the Patent Trial and Appeal Board dated Sep. 25, 2017 issued in U.S. Appl. No. 13/494,836.
U.S. Notice of Allowance dated Oct. 2, 2018 issued in U.S. Appl. No. 13/494,836.
Taiwan Office Action dated Nov. 6, 2017 issued in Application No. TW 103119100.
Taiwan Notice of Allowance dated Jan. 8, 2019 issued in Application No. TW 107126975.
Singapore Notice of Allowance & Supplemental Exam Report dated Nov. 30, 2017 issued in Application No. SG 10201402381U.
Chinese First Office Action dated Sep. 5, 2016 issued in Application No. CN 201410576747.1.
Chinese First Office Action dated Dec. 20, 2018 issued in Application No. CN 201710307116.3.
Taiwan Notice of Allowance and Search Report dated Jun. 14, 2018 issued in Application No. TW 103136697.
Taiwan First Office Action dated Dec. 24, 2018 issued in Application No. TW 107123391.
Chinese First Office Action dated Jan. 3, 2018 issued in Application No. CN 201610084166.5.
Chinese Second Office Action dated Oct. 12, 2018 issued in Application No. CN 201610084166.5.
Chinese First Office Action dated Jun. 25, 2018 issued in Application No. CN 201610251266.2.
Chinese Second Office Action [Decision of Final Rejection] dated Jan. 25, 2019 issued in Application No. CN 201610251266.2.
Chinese First Office Action dated Jan. 24, 2014 issued in Application No. CN 201010569747.0.
Chinese Second Office Action dated Aug. 14, 2014 issued in Application No. CN 201010569747.0.
Chinese Third Office Action dated Jan. 13, 2015 issued in Application No. CN 201010569747.0.
Chinese First Office Action dated Jul. 3, 2017 issued in Application No. CN 201510566292.X.
Japanese Office Action dated Jul. 29, 2014 issued in Application No. JP 2010-256165.
Korean Office Action dated Feb. 20, 2017 issued in Application No. KR 10-2010-0123145.
Korean First Office Action dated Feb. 1, 2018 issued in Application No. KR 10-2017-0147917.
Taiwan Notice of Allowance and Search Report dated Jul. 8, 2015 issued in Application No. TW 099140866.
Taiwan Office Action dated Jan. 14, 2016 issued in Application No. TW 104126278.
Taiwan Examination Report dated Mar. 14, 2017 issued in Application No. TW 102146997.
Taiwan Examination Report dated Aug. 8, 2017 issued in Application No. TW 102146997.
Taiwan Office Action dated Dec. 22, 2015 issued in Application No. TW 102120742.
PCT International Search Report and Written Opinion (ISA/KR) dated Dec. 26, 2017 issued in PCT/US2017/051794.
PCT International Preliminary Report on Patentability dated Apr. 11, 2019 (ISA/KR) dated Apr. 11, 2019 issued in PCT/US2017/051794.
PCT International Search Report and Written Opinion (ISA/KR) dated Mar. 15, 2018 issued in PCT/US2017/062882.
PCT International Search Report and Written Opinion (ISA/KR) dated Mar. 19, 2018 issued in PCT/US2017/064024.
Benilan et al., (Oct. 4, 2011) "Optimization of microwave Hydrogen plasma discharges to mimic Lyman α(121.6 nm) solar irradiations," *EPSC-DPS2011-1317, EPSC-DPJ Joint Meeting 2011, EPSC Abstracts*, 6:2pp.

(56) References Cited

OTHER PUBLICATIONS

Blaszczyk-Lezak et al., (2005) "Silicon Carbonitride Films Produced by Remote Hydrogen Microwave Plasma CVD Using a (Dimethylamino)dimethylsilane Precursor," *Chemical Vapor Deposition*, 11(1):44-52.

"Development of Current Atomic Theory," Emission Spectrum of Hydrogen, [downloaded at http://chemed.chem.purdue.edu/genchem/topicreview/bp/ch6/bohr.html on Sep. 23, 2015], 7 pp.

"Dummies' Guide to Hydrogen," *Molecular Hydrogen Foundation, MHF*, [downloaded at http://www.molecularhydrogenfoundation.org/core-information/dummies-guide-to-hydrogen on Sep. 23, 2015], 2 pp.

Fozza et al., (Jan./Feb. 1998) "Vacuum ultraviolet to visible emission of some pure gases and their mixtures used for plasma processing," *J. Vac. Sci. Technol. A, American Vacuum Society*, 16(1):72-77.

Fozza et al., (Jul. 2000) "Vacuum ultraviolet to visible emission from hydrogen plasma: Effect of excitation frequency," *Journal of Applied Physics*, 88(1):20-33.

Grubbs et al. (May/Jun. 2006) "Attenuation of hydrogen radicals traveling under flowing gas conditions through tubes of different materials," *J. Vac. Sci. Technol. A*, 24(3):486-496.

Hatanaka et al., (2000) "Experiments and analyses of SiC thin film deposition from organo-silicon by a remote plasma method," *Thin Solid Films*, 368:287-291.

Holländer et al., (May 1994) "Vacuum ultraviolet emission from microwave plasmas of hydrogen and its mixtures with helium and oxygen," *J. Vac. Sci. Technol. A*, 12(3):879-882.

Huran, J., et al., (2004) "RBS study of amorphous silicon carbide films deposited by PECVD," *Czechoslovak Journal of Physics*, 54(Suppl. C):C1006-C1010.

Jones et al., (Nov. 30, 2001) "Silicon Containing Polymers: The Science and Technology of Their Synthesis and Applications," *Springer*, p. 705.

Lemaire, P.J., Walker, K.L., Kranz, K.S., Huff, R.G. and DiMarcello, F.V., (1990) "Diffusion of Hydrogen Through Hermetic Carbon Films on Silica Fibers," AT&T Bell Laboratories, 600 Mountain Avenue, Murray Hill, NJ 07974, *Mat. Res. Soc. Symp. Proc.* vol. 172, 12 pages, © 1990 Materials Research Society.

Maeda et al. (Sep. 1989), "A Low-Permittivity Interconnection Using an SiBN Interlayer," *IEEE Transactions on Electron Devices* 36(9).

Sugino, Takashi et al. (2001), "Synthesis of boron nitride film with low dielectric constant for its application to silicon ultralarge scale integrated semiconductors," *Diamond and Related Materials*, pp. 1275-1379, Elsevier Science B.V.

Wróbel et al. (2001) "Oligomerization and Polymerization Steps in Remote Plasma Chemical Vapor Deposition of Silicon-Carbon and Silica Films from Organosilicon Sources," *Chem. Mater*, 13(5):1884-1895.

Wróbel et al., (2010) "Reactivity of Organosilicon Precursors in Remote Hydrogen Microwave Plasma Chemical Vapor Deposition of Silicon Carbide and Silicon Carbonitride Thin-Film Coatings," *Appl. Organometal. Chem.*, 24:201-207.

Wu et al. (Oct. 17-19, 2006), "Ultra Low k Dielectrics Prepared by PECVD Using a Single-Precursor and Treated by UV Assisted Thermal Processing," *Advanced Metallization Conference (AMC) 2006*, pp. 1-6, San Diego, CA.

Xu, Ying-Yu, et al., (1999) "Preparation of SiC Thin Film Using Organosilicon by Remote Plasma CVD Method," *Mat. Res. Soc. Symp. Proc.*, 544:185-189.

U.S. Appl. No. 11/693,661, filed Mar. 29, 2007, Wu et al.
U.S. Appl. No. 16/041,153, filed Jul. 20, 2018, Weimer et al.
U.S. Appl. No. 16/194,102, filed Nov. 16, 2018, Tang et al.
U.S. Appl. No. 16/240,133, filed Jan. 4, 2019, Varadarajan.
U.S. Final Office Action dated Nov. 5, 2010 issued in U.S. Appl. No. 11/693,661.
U.S. Office Action dated Aug. 28, 2009 issued in U.S. Appl. No. 11/693,661.
U.S. Office Action dated Feb. 24, 2010 issued in U.S. Appl. No. 11/693,661.
U.S. Notice of Allowance dated Jun. 18, 2019 issued in U.S. Appl. No. 14/961,637.
U.S. Office Action dated Apr. 18, 2019 issued in U.S. Appl. No. 15/972,554.
U.S. Notice of Allowance dated Oct. 22, 2019 issued in U.S. Appl. No. 15/972,554.
Chinese Second Office Action dated Jun. 3, 2019 issued in Application No. CN 201710307116.3.
Chinese Third Office Action dated Apr. 22, 2019 issued in Application No. CN 201610084166.5.
PCT International Preliminary Report on Patentability (ISA/KR) dated Jun. 6, 2019 issued in PCT/US2017/062882.
PCT International Preliminary Report on Patentability (ISA/KR) dated Jun. 27, 2019 issued in PCT/US2017/064024.
Korean First Office Action dated Aug. 9, 2019 issued in Application No. KR 10-2013-0066728.
Taiwanese Second Office Action dated Apr. 18, 2019 issued in Application No. TW 107123391.
Taiwanese Third Office Action dated Aug. 21, 2019 issued in Application No. TW 107123391.
Taiwanese First Office Action dated Jul. 31, 2019 issued in Application No. TW 105103396.
International Search Report and Written Opinion dated Oct. 25, 2019 issued in Application No. PCT/US2019/042413.
Boo et al., (1999) "Growth of boron nitride thin films on silicon substrates using new organoboron precursors" Phys. Stat. sol. (a), vol. 176. Nov. 1999, pp. 705-710.
Sota et al., (2010) "Influence of atomic bonds on electrical property of boron carbon nitride films synthesized by remote plasma-assisted chemical vapor deposition. Diamond & Related Materials" vol. 19, No. 12, Jun. 23, 2010, pp. 1441-1445.
G.E. Coates et al., "Chapter Four: Organometallic compounds of elements of main groups IV and V," Principles of Organometallic Chemistry, (1968) pp. 121-122.
"Radical (chemistry)" From Wikipedia, the free encyclopedia, [downloaded at http://en.wikipedia.org/wiki/Radical_(chemistry) on Sep. 23, 2015), 11 pages.
U.S. Appl. No. 16/556,145, filed Aug. 29, 2019, Varadarajan.
U.S. Office Action dated Jul. 9, 2019 issued in U.S. Appl. No. 16/041,153.
U.S. Office Action dated Dec. 2, 2019 issued in U.S. Appl. No. 15/169,530.
U.S. Final Office Action dated Apr. 10, 2020 issued in U.S. Appl. No. 15/169,530.
U.S. Office Action dated Mar. 19, 2020 issued in U.S. Appl. No. 16/194,102.
U.S. Final Office Action dated Dec. 12, 2019 issued in U.S. Appl. No. 16/041,153.
U.S. Notice of Allowance dated Mar. 25, 2020 issued in U.S. Appl. No. 16/041,153.
Chinese Third Office Action dated Dec. 9, 2019 issued in Application No. CN 201710307116.3.
Korean First Office Action dated Jan. 30, 2020 issued in Application No. KR 2013-0158829.
Korean Decision for Grant of Patent dated Dec. 27, 2019 issued in Application No. KR 10-2013-0066728.
PCT International Search Report and Written Opinion (ISA/KR) dated Nov. 8, 2019 issued in Application No. PCT/US2019/042821.
PCT International Search Report and Written Opinion (ISA/KR) dated Nov. 20, 2019 issued in Application No. PCT/US2019/042812.

\* cited by examiner

REMOTE PLASMA BASED DEPOSITION OF OXYGEN DOPED SILICON CARBIDE FILMS

CROSS-REFERENCE TO RELATED APPLICATIONS

This application is a continuation-in-part of U.S. patent application Ser. No. 13/494,836, titled "REMOTE PLASMA BASED DEPOSITION OF SIOC CLASS OF FILMS," filed on Jun. 12, 2012, which is hereby incorporated by reference in its entirety and for all purposes. This application also claims the benefit of priority to U.S. Provisional Patent Application No. 62/385,784, titled "REMOTE PLASMA BASED DEPOSITION OF OXYGEN DOPED SILICON CARBIDE FILMS," filed Sep. 9, 2016, which is hereby incorporated by reference in its entirety and for all purposes.

BACKGROUND

The present disclosure relates generally to the formation of oxygen doped silicon carbide films.

The silicon carbide (SiC) class of thin films has unique physical, chemical, and mechanical properties and is used in a variety of applications, particularly integrated circuit applications. One such SiC class of thin films includes oxygen doped SiC.

SUMMARY

This disclosure pertains to a method of depositing oxygen doped silicon carbide (SiCO) film. The method includes providing a substrate and flowing one or more silicon-containing precursors onto the substrate, where each of the one or more silicon-containing precursors has (i) one or more silicon-hydrogen bonds and/or silicon-silicon bonds and (ii) one or more silicon-oxygen bonds and one or more silicon-carbon bonds. The method further includes flowing a source gas into a remote plasma source, generating radicals of hydrogen in the remote plasma source from the source gas, and introducing the radicals of hydrogen onto the substrate, where at least 90% of the radicals are radicals of hydrogen in a substantially low energy state that react with the one or more silicon-containing precursor to form SiCO film on the substrate under conditions that break one or both of silicon-hydrogen bonds and silicon-silicon bonds but preserve the silicon-oxygen bonds and the silicon-carbon bonds.

In some implementations, the silicon-containing precursors include cyclic siloxanes. In some implementations, the silicon-containing precursors include alkoxy silanes. In some implementations, the radicals are produced from a source gas of hydrogen. In some implementations, the ratio of silicon-oxygen bonds to silicon-carbon bonds in the SiCO film is between about 0.5:1 and about 3:1. In some implementations, the SiCO film comprises a conformal thin film on the substrate. In some implementations, the substrate comprises a transistor having a gate electrode, and the method further comprises forming the SiCO film on one or more sidewalls of the gate electrode.

This disclosure also pertains to an apparatus for depositing an oxygen doped silicon carbide film on a substrate. The apparatus includes a reaction chamber comprising a substrate support for supporting the substrate, a remote plasma source coupled to the reaction chamber and configured to generate a plasma outside the reaction chamber, one or more gas inlets coupled to the reaction chamber, and a controller comprising instructions for performing the following operations: (a) flowing one or more silicon-containing precursors onto the substrate, where each of the one or more silicon-containing precursors has (i) one or more silicon-hydrogen bonds and/or silicon-silicon bonds and (ii) one or more silicon-oxygen bonds and one or more silicon-carbon bonds, (b) flowing a source gas into the remote plasma source, (c) generating radicals of hydrogen in the remote plasma source from the source gas, and (d) introducing the radicals of hydrogen onto the substrate, where at least 90% of the radicals are radicals of hydrogen in a substantially low energy state that react with the one or more silicon-containing precursor to form SiCO film on the substrate under conditions that break one or both of silicon-hydrogen bonds and silicon-silicon bonds but preserve the silicon-oxygen bonds and the silicon-carbon bonds.

In some implementations, the silicon-containing precursors include cyclic siloxanes. In some implementations, the silicon-containing precursors include alkoxy silanes. In some implementations, the radicals are produced from a source gas of hydrogen. In some implementations, the ratio of silicon-oxygen bonds to silicon-carbon bonds in the SiCO film is between about 0.5:1 and about 3:1. In some implementations, the SiCO film comprises a conformal thin film on the substrate. In some implementations, the substrate comprises a transistor having a gate electrode, and the controller further comprises instructions for forming the SiCO film on one or more sidewalls of the gate electrode.

DETAILED DESCRIPTION

Figure 1A:
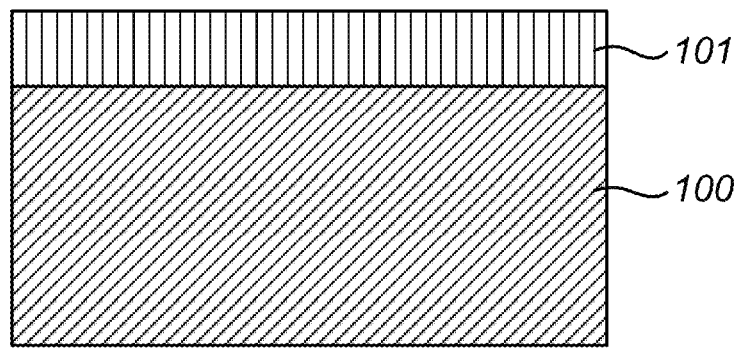
FIG. 1A illustrates a cross-section of an example of an oxygen doped silicon carbide film deposited over a substrate.

In the following description, numerous specific details are set forth in order to provide a thorough understanding of the presented concepts. The presented concepts may be practiced without some or all of these specific details. In other instances, well known process operations have not been described in detail so as to not unnecessarily obscure the described concepts. While some concepts will be described in conjunction with the specific embodiments, it will be understood that these embodiments are not intended to be limiting.

In this application, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication thereon. A wafer or substrate used in the semiconductor device industry typically has a diameter of 200 mm, or 300 mm, or 450 mm. The following detailed description assumes the invention is implemented on a wafer. However, the invention is not so limited. The work piece may be of various shapes, sizes, and materials. In addition to semiconductor wafers, other work pieces that may take advantage of this invention include various articles such as printed circuit boards, magnetic recording media, magnetic recording sensors, mirrors, optical elements, micro-mechanical devices and the like.

Introduction

Manufacture of semiconductor devices typically involves depositing one or more thin films on a substrate in an integrated fabrication process. In some aspects of the fabrication process, classes of thin films such as SiC and SiCN are deposited using atomic layer deposition (ALD), chemical vapor deposition (CVD), plasma-enhanced chemical vapor deposition (PECVD), or any other suitable deposition method.

Another class of thin films that can be deposited includes silicon oxycarbide (SiOC). Conventional SiOC films are typically formed by doping silicon oxide with carbon. Silicon-containing precursors may be delivered with carbon-containing precursors such as methane, carbon dioxide, or carbon monoxide. A silicon oxide film with inclusions of carbon may be formed using a suitable deposition process. In some implementations, precursor molecules for depositing SiOC can include silicon-containing molecules having silicon-hydrogen (Si—H) bonds, silicon-silicon (Si—Si) bonds, silicon-carbon (Si—C) bonds, and/or silicon-oxygen (Si—O) bonds. Current PECVD processes may use in situ plasma processing in which a plasma is provided directly adjacent to a processed substrate.

It has been found that depositing high-quality SiOC thin films can have certain challenges, such as providing films with excellent step coverage, low dielectric constants, high breakdown voltages, low leakage currents, high porosity, and/or coverage over exposed metal surfaces without oxidizing the metal surfaces.

While this disclosure is not limited by any particular theory, it is believed that the plasma conditions in typical PECVD processes fragment the silicon-containing precursor molecules in a manner that produces undesirable effects. For example, PECVD may break Si—O and/or Si—C bonds in the precursor molecules to produce highly reactive radicals or other fragment types having high sticking coefficients. The fragments and the resulting SiOC film can include silicon, carbon, and/or oxygen atoms with bonds that are "dangling," meaning that silicon, carbon, and/or oxygen atoms have reactive unpaired valence electrons. High sticking coefficients of the precursor molecules and their fragments can deposit SiOC films with poor step coverage, as reactive precursor fragments may disproportionately stick to the upper regions of sidewalls and other structures in recessed features. The dangling bonds can produce silanol groups (Si—OH) in a deposited SiOC film. As a result, the film may have detrimentally high dielectric constants. Film quality may also suffer because the direct plasma conditions tend to extract carbon out of the deposited film.

Furthermore, the dangling bonds can produce increased silicon-hydrogen bonding (Si—H) in deposited SiOC films. Broken bonds of Si—C can be replaced with Si—H in direct plasma deposition conditions. The presence of Si—H bonds in SiOC films can produce films with poor electrical properties. For example, the presence of Si—H bonds can reduce breakdown voltages and can increase leakage currents because the Si—H bonds provide a leakage path for electrons.

Further, the dangling bonds can lead to uncontrolled chemical or morphological structures in the SiOC films. In some cases, such structures are dense filaments having low or no porosity, such that the film has an unacceptably high dielectric constant. The lack of porosity can be the result of the direct plasma conditions breaking Si—C and/or Si—O bonds in cyclic siloxanes that would otherwise provide porosity in an ultralow-k dielectric material.

Direct plasma conditions sometimes employed in PECVD can lead to directionality in the deposition because the energy to break up the precursor molecules can be a low frequency which creates a lot of ion bombardment at the surface. The directional deposition can also lead to deposition of SiOC films with poor step coverage. A direct plasma is a plasma in which the plasma (electrons and positive ions at an appropriate concentration) reside in close proximity to the substrate surface during deposition, sometimes separated from the substrate surface by only a plasma sheath.

Typical PECVD processes are sometimes inappropriate for depositing SiOC films over exposed copper or other metal surfaces because such processes can oxidize metal. The PECVD process may use oxidants such as oxygen ($O_2$), ozone ($O_3$), carbon dioxide ($CO_2$), carbon monoxide (CO), or other oxidizing species to form SiOC.

Environment at the Substrate Surface During Deposition

FIG. 1A illustrates a cross-section of an example of an oxygen doped silicon carbide film deposited over a substrate. The oxygen doped silicon carbide film 101 can be formed under process conditions and producing a relatively mild environment adjacent to the substrate 100. The substrate 100 can be any wafer, semiconductor wafer, partially fabricated integrated circuit, printed circuit board, display screen, or other appropriate work piece. The process for depositing the oxygen doped silicon carbide film 101 can include one or more silicon-containing precursors having one or more Si—H bonds and/or one or more Si—Si bonds.

Figure 1B:
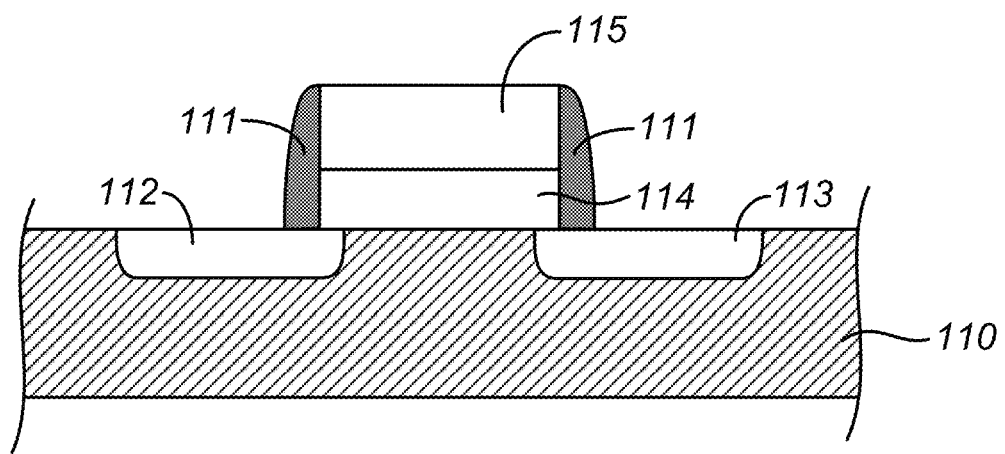
FIG. 1B illustrates oxygen doped silicon carbide vertical structures on the sidewalls of a gate electrode structure of a transistor.
Figure 1C:
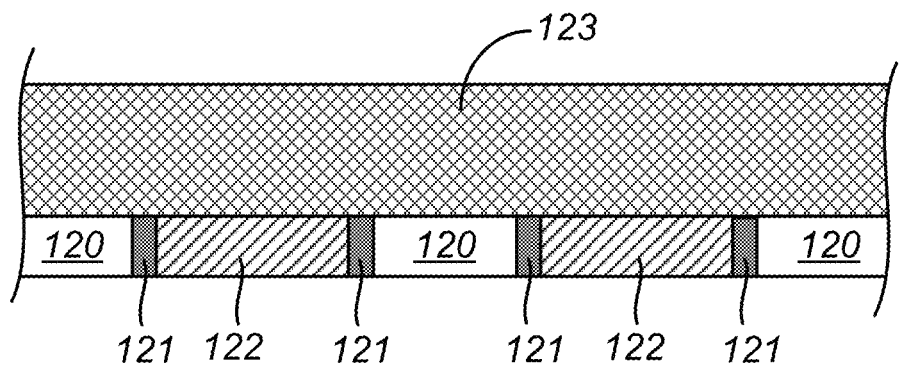
FIG. 1C illustrates oxygen doped silicon carbide vertical structures on exposed sidewalls of copper lines in an air gap type metallization layer.
Figure 1D:
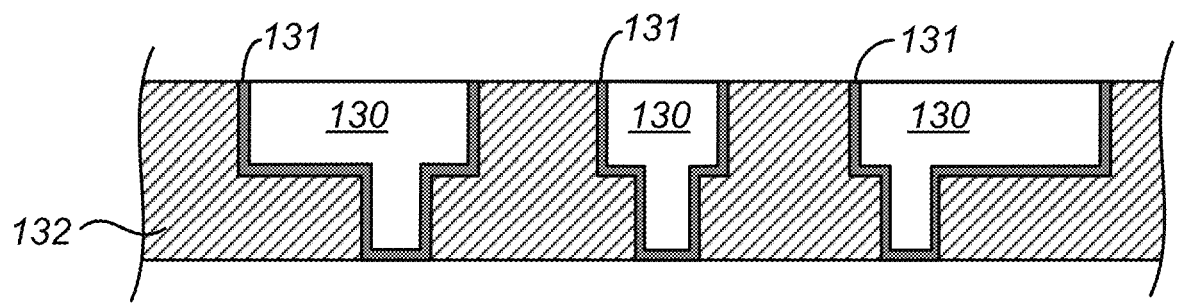
FIG. 1D illustrates oxygen doped silicon carbide pore sealants for porous dielectric materials.

Certain applications employing oxygen doped silicon carbide films are depicted in FIGS. 1B-1D. In some embodiments, the silicon-containing precursors can include silicon-oxygen containing precursors and/or silicon-carbon containing precursors. The silicon-oxygen containing precursors can include one or more Si—O bonds and the silicon-carbon containing precursors can include one or more Si—C bonds. In some embodiments, for example, the silicon-containing precursors can include a single reactant A with Si—O and Si—C bonds. In some embodiments, the silicon-containing precursors can include a reactant B with Si—O bonds and a reactant C with Si—C bonds. It will be understood that any number of suitable reactants may be employed in the scope of this present disclosure. The chemical structures of exemplary silicon-containing precursors are discussed in further detail below.

The silicon-containing precursors include one or more Si—H bonds and/or one or more Si—Si bonds. During the deposition process, the Si—H bonds and/or Si—Si bonds will be broken and serve as reactive sites for forming bonds between the silicon-containing precursors in the deposited oxygen doped silicon carbide film 101. The broken bonds can also serve as sites for cross-linking during thermal processing conducted during or after deposition. Bonding at the reactive sites and cross-linking can form a primary backbone or matrix collectively in the resulting oxygen doped silicon carbide film 101.

In some embodiments, the process conditions can preserve or at least substantially preserve Si—O and Si—C bonds in the as-deposited layer of the oxygen doped silicon carbide film 101. Accordingly, the reaction conditions adjacent to the substrate 100 provide for the breaking of Si—H and/or Si—Si bonds, e.g., extracting hydrogen from the broken Si—H bonds, but the reaction conditions do not provide for extracting oxygen from Si—O bonds or carbon from Si—C bonds. Generally, the described reaction conditions exist at the exposed face of the substrate (the face where the oxygen doped silicon carbide film is deposited). They may further exist at some distance above the work piece, e.g., about 0.5 micrometers to about 150 millimeters above the work piece. In effect, activation of the precursor can happen in the gas phase at a substantial distance above the work piece. Typically, the pertinent reaction conditions will be uniform or substantially uniform over the entire exposed face of the substrate, although certain applications may permit some variation.

In addition to silicon-containing precursors, the environment adjacent the work piece can include one or more radical species, preferably in a substantially low energy state. An example of such species includes hydrogen atom radicals. In some embodiments, all, or substantially all, or a substantial fraction of the hydrogen atom radicals can be in the ground state, e.g., at least about 90% or 95% of the hydrogen atom radicals adjacent the work piece are in the ground state. In certain embodiments, hydrogen is provided in a carrier such helium. As an example, hydrogen gas may be provided in a helium carrier at a concentration of about 1-10% hydrogen. Pressure, fraction of carrier gas such as helium, and other process conditions are chosen so that the hydrogen atoms encounter the substrate as radicals in a low energy state without recombining.

As explained elsewhere, hydrogen gas may be supplied into a remote plasma source to generate hydrogen radicals. Once generated, the hydrogen radicals may be in an excited energy state. For example, hydrogen in an excited energy state can have an energy of at least 10.2 eV (first excited state). Excited hydrogen radicals may cause unselective decomposition of the silicon-containing precursor. For example, hydrogen radicals in an excited state can easily break Si—H, Si—Si, Si—O, and Si—C bonds, which can alter the composition or physical or electrical characteristics of the silicon carbide film. In some implementations, when the excited hydrogen radicals lose their energy, or relax, the excited hydrogen radical may become a substantially low energy state hydrogen radical or a ground state hydrogen radical. Hydrogen radicals in a substantially low energy state or ground state can be capable of selectively breaking Si—H and Si—Si bonds while generally preserving Si—O and Si—C bonds. In some implementations, process conditions may be provided so that excited hydrogen radicals lose energy or relax to form substantially low energy state or ground state hydrogen radicals. For example, the remote plasma source or associated components may be designed so that a residence time of hydrogen radicals diffusing from the remote plasma source to the substrate is greater than the energetic relaxation time of an excited hydrogen radical. The energetic relaxation time for an excited hydrogen radical can be about equal to or less than about $1 \times 10^{-3}$ seconds.

A state in which a substantial fraction of hydrogen atom radicals are in the ground state can be achieved by various techniques. Some apparatus, such as described below, are designed to achieve this state. Apparatus features and process control features can be tested and tuned to produce a mild state in which a substantial fraction of the hydrogen atom radicals are in the ground state. For example, an apparatus may be operated and tested for charged particles downstream of the plasma source; i.e., near the substrate. The process and apparatus may be tuned until substantially no charged species exist near the substrate. Additionally, apparatus and process features may be tuned to a configuration where they begin to produce a high quality silicon carbide film from a standard precursor such as trimethylsilane. The relatively mild conditions that support such film deposition are chosen.

Other examples of radical species include nitrogen-containing species, such as elemental nitrogen radicals (atomic or biatomic) and N—H containing radicals such as ammonia radicals, where nitrogen is optionally incorporated into the film. Examples of N—H containing radicals include but are not limited to radicals of methylamine, dimethylamine, and aniline. The aforementioned radical species may be produced from a gas that includes hydrogen, nitrogen, N—H containing species, or mixtures thereof. In some embodiments, essentially all atoms of the deposited film are provided by the precursor molecules. In such cases, the low energy radicals used to drive the deposition reaction may be exclusively hydrogen or other species that does not substantially contribute to the mass of the deposited layer. In some embodiments, as discussed in further detail below, the radical species can be produced by a remote plasma source. In some embodiments, radicals of higher energy state or even ions can potentially be present near the wafer plane.

In some embodiments, the process conditions employ radical species in a substantially low energy state sufficient to break Si—H bonds and/or Si—Si bonds while preserving or at least substantially preserving Si—O and Si—C bonds. Such process conditions may not have substantial amounts of ions, electrons, or radical species in high energy states such as states above the ground state. In some embodiments, the concentration of ions in the region adjacent the film is no greater than about $10^7/cm^3$. The presence of substantial amounts of ions or high energy radicals may tend to break Si—O or Si—C bonds, which can produce films with undesirable electrical properties (e.g., high dielectric constants and/or low breakdown voltages) and poor conformality. It is believed that an excessively reactive environment produces reactive precursor fragments that have high sticking coefficients (representing a propensity to chemically or physically stick to work piece sidewalls), resulting in poor conformality.

The silicon-containing precursors are typically delivered with other species, notably carrier gas, in the environment adjacent to the substrate 100. In some implementations, the silicon-containing precursors are present with the radical species and other species, including other reactive species and/or carrier gases. In some embodiments, the silicon-containing precursors may be introduced as a mixture. Upstream from the deposition reaction surface, the silicon-containing precursors can be mixed with an inert carrier gas. Example inert carrier gases include, but are not limited to, nitrogen ($N_2$), argon (Ar), and helium (He). In addition, the silicon-containing precursors can be introduced in a mixture having major and minor species, with the minor species containing some element or structural feature (e.g., a ring structure, a cage structure, an unsaturated bond, etc.) that is present in the oxygen doped silicon carbide film 101 at a relatively low concentration. The multiple precursors may be present in equimolar or relatively similar proportions as appropriate to form the primary backbone or matrix in the resulting oxygen doped silicon carbide film 101. In other embodiments, the relative amounts of the different precursors are substantially skewed from equimolarity.

In some embodiments, one or more silicon-containing precursors provide essentially all of the mass of the deposited silicon carbide film, with small amounts of hydrogen or other element from a remote plasma providing less than about 5% atomic or less than about 2% atomic of the film mass. In some embodiments, only the radical species and one or more silicon-containing precursors contribute to the composition of the deposited silicon carbide film. In other embodiments, the deposition reaction includes a co-reactant other than one or more silicon-containing precursors and the radical species. Examples of such co-reactants include carbon dioxide ($CO_2$), carbon monoxide (CO), water ($H_2O$), methanol ($CH_3OH$), oxygen ($O_2$), ozone ($O_3$), nitrogen ($N_2$), nitrous oxide ($N_2O$), ammonia ($NH_3$), methane ($CH_4$), ethane ($C_2H_6$), acetylene ($C_2H_2$), ethylene ($C_2H_4$), diborane, and combinations thereof. Such materials may be used as nitriding agents, oxidizers, reductants, etc. In some cases, they can be used to tune the amount of carbon in the deposited film by removing a fraction of the carbon provided with the silicon-containing precursor. In some implementations employing a non-hydrogen co-reactant, the co-reactant is introduced to the reactor via the same flow path as the silicon-containing precursor; e.g., a path including a showerhead, typically without direct exposure to plasma. In some embodiments, oxygen and/or carbon dioxide is introduced with the precursor to alter the composition of the silicon carbide film by removing carbon from the film or precursor during deposition. In some implementations employing a non-hydrogen co-reactant, the co-reactant is introduced to the reactor via the same flow path as the hydrogen, such that the co-reactant is at least partially converted to radicals and/or ions. In such implementations, the hydrogen radicals and the co-reactant radicals both react with the silicon-containing precursor(s) to produce the deposited silicon carbide film.

In certain embodiments where co-reactants are used and they are introduced to the chamber with the species being converted to radicals (e.g., hydrogen), they are provided to reactor in relatively small amounts in comparison to the other gases in the reactor, including the source of radicals (e.g., hydrogen) any carrier gas(es) such as helium. For example, the co-reactant may be present in the process gases at about 0.05% or less by mass, or at about 0.01% or less by mass, or at about 0.001% or less by mass. For example, a reactant mixture (that goes into the plasma source) may be about 10 L/m He, about 200-500 sccm H2, and about 1-5 sccm oxygen. When the co-reactants are introduced to the chamber along with the silicon-containing precursor (e.g., through a showerhead), they may be present at a higher concentration; for example about 2% or less or about 0.1% or less. When the co-reactant is a relatively weak reactant (e.g., a weak oxidant such as carbon dioxide), it may be present at even higher concentrations, such as about 10% or less or about 4% or less.

The temperature in the environment adjacent to the substrate 100 can be any suitable temperature facilitating the deposition reaction, but sometimes limited by the application of the device containing the oxygen doped silicon carbide film 101. The temperature in the environment adjacent to the substrate 100 can be largely controlled by the temperature of a pedestal on which a substrate 100 is supported during deposition of the oxygen doped silicon carbide film 101. In some embodiments, the operating temperature can be between about 50° C. and about 500° C. For example, the operating temperature can be between about 250° C. and about 400° C. in many integrated circuit applications. In some embodiments, increasing the temperature can lead to increased cross-linking on the substrate surface.

The pressure in the environment adjacent to the substrate 100 can be any suitable pressure to produce reactive radicals in a process chamber. In some embodiments, the pressure can be about 35 Torr or lower. For example, the pressure can be between about 10 Torr and about 20 Torr, such as in embodiments implementing a microwave generated plasma. In other examples, the pressure can be less than about 5 Torr, or between about 0.2 Torr and about 5 Torr, such as in embodiments implementing a radiofrequency (RF) generated plasma.

Figure 1E:
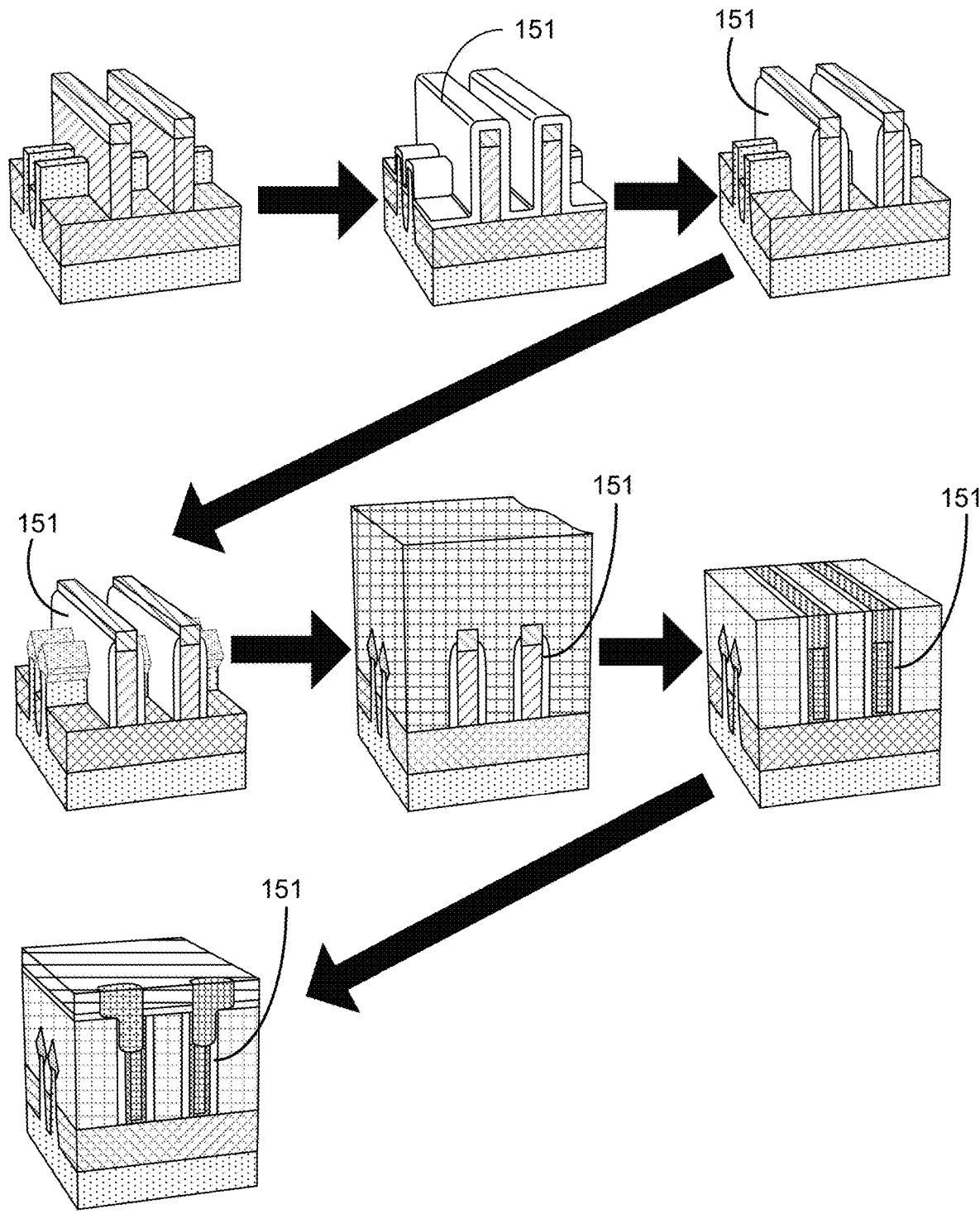
FIG. 1E illustrates three-dimensional schematic representations in an example integration flow for manufacturing fin field-effect transistor (finFET) structures.

FIGS. 1B-1E illustrate cross-sections of structures containing oxygen doped silicon carbide films in a variety of applications. FIG. 1B illustrates oxygen doped silicon carbide vertical structures on the sidewalls of a gate electrode structure of a transistor. FIG. 1C illustrates oxygen doped silicon carbide vertical structures on exposed sidewalls of copper lines in an air gap type metallization layer. FIG. 1D illustrates oxygen doped silicon carbide pore sealants for porous dielectric materials. FIG. 1E illustrates oxygen doped silicon carbide spacers through an integration flow in fin field-effect transistor (finFET) structures. Each of these applications is discussed in further detail below.

Chemical Structure of Precursors

As discussed, the precursors employed in forming oxygen doped silicon carbide films can include silicon-containing precursors, with at least some of the silicon-containing precursors having at least one Si—H and/or at least one Si—Si bond. In certain embodiments, the silicon-containing precursor has at most one hydrogen atom on every silicon atom. Thus, for example, a precursor having one silicon atom has at most one hydrogen atom bonded to the silicon atom; a precursor having two silicon atoms has one hydrogen atom bonded to one silicon atom and optionally another hydrogen atom bonded to the second silicon atom; a precursor having three silicon atoms has at least one hydrogen atom bonded to one silicon atom and optionally one or two more hydrogen atoms bonded to one or two of the remaining silicon atoms, and so on. In addition, the silicon-containing precursors may include at least one Si—O bond and/or at least one Si—C bond. While any number of appropriate precursors can be used in forming oxygen doped silicon carbide films, at least some of the precursors will include silicon-containing precursors with at least one Si—H bond or Si—Si bond, and optionally at least one Si—O bond and/or Si—C bond. In some implementations, the silicon-containing precursor(s) contain no O—C bonds, e.g., the precursor(s) contain no alkoxy (—O—R), where R is an organic group such as a hydrocarbon group.

In certain embodiments, at least some of the carbon provided for the oxygen doped silicon carbide film is provided by one or more hydrocarbon moieties on the silicon-containing precursor. Such moieties may be from alkyl groups, alkene groups, alkyne groups, aryl groups, and the like. In certain embodiments, the hydrocarbon group has a single carbon atom to minimize steric hindrance of the Si—H and/or Si—Si bond breaking reaction during deposition. However, the precursors are not limited to single-carbon groups; higher numbers of carbon atoms may be used such as 2, 3, 4, 5, or 6 carbon atoms. In certain embodiments, the hydrocarbon group is linear. In certain embodiments, the hydrocarbon group is cyclic.

In some embodiments, the silicon-containing precursors fall into one of three or more chemical classes, any of which may be present alone as the sole precursor or in combination with other types of precursors. It will be understood that other chemical classes of silicon-containing precursors may be employed and that the silicon-containing precursors are not limited to the chemical classes discussed below.

First, the silicon-containing precursor can be a siloxane. In some embodiments, the siloxane may be cyclic. Cyclic siloxanes may include cyclotetrasiloxanes, such as 2,4,6,8-tetramethylcyclotetrasiloxane (TMCTS), octamethylcyclotetrasiloxane (OMCTS), and heptamethylcyclotetrasiloxane (HMCTS). Other cyclic siloxanes can also include but are not limited to cyclotrisiloxanes and cyclopentasiloxanes. Embodiments using cyclic siloxanes are ring structures that can introduce porosity into an oxygen doped silicon carbide film, with the size of the pores corresponding to the radius of the ring. For example, a cyclotetrasiloxane ring can have a radius of about 6.7 Å.

Figure 2:
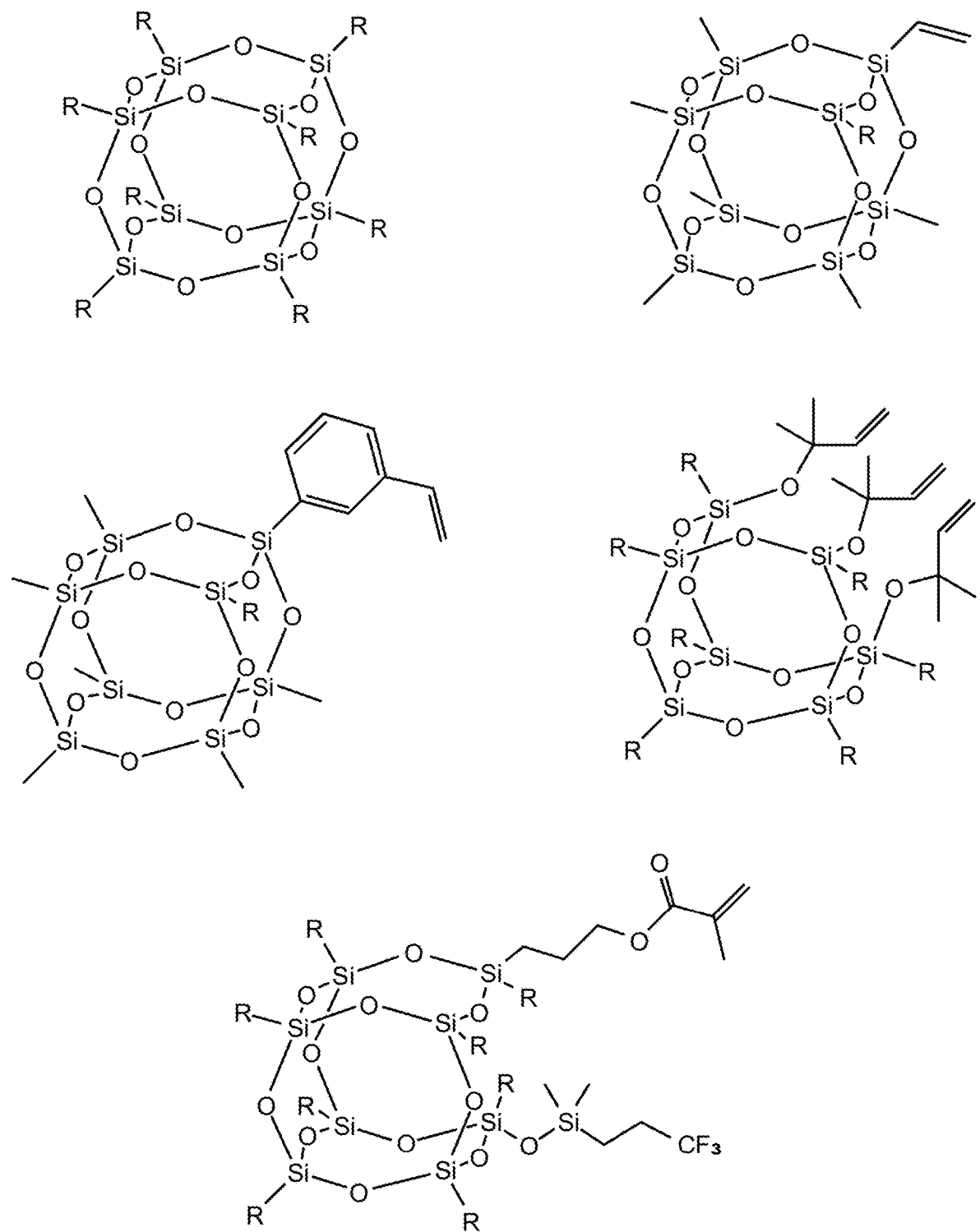
FIG. 2 illustrates examples of representative caged siloxane precursors.

In some embodiments, the siloxane may have a three-dimensional or caged structure. FIG. 2 illustrates examples of representative caged siloxane precursors. Caged siloxanes have silicon atoms bridged to one another via oxygen atoms to form a polyhedron or any 3-D structure. An example of a caged siloxane precursor molecule is silsesquioxane. Caged siloxane structures are described in further detail in commonly owned U.S. Pat. No. 6,576,345 to Cleemput et al., which is incorporated by reference herein in its entirety and for all purposes. Like the cyclic siloxanes, the caged siloxane can introduce porosity into an oxygen doped silicon carbide film. In some embodiments, the porosity scale is mesoporous.

In some embodiments, the siloxane may be linear. Examples of suitable linear siloxanes include but are not limited to disiloxanes, such as pentamethyldisiloxane (PMDSO) and tetramethyldisiloxane (TMDSO), and trisiloxanes such as hexamethyltrisiloxane, heptamethyltrisiloxane.

Second, the silicon-containing precursor can be an alkyl silane or other hydrocarbon-substituted silane. The alkyl silanes include a central silicon atom with one or more alkyl groups bonded to it as well as one or more hydrogen atoms bonded to it. In certain embodiments, any one or more of the alkyl groups contain 1-5 carbon atoms. The hydrocarbon groups may be saturated or unsaturated (e.g., alkene (e.g., vinyl), alkyne, and aromatic groups). Examples include but are not limited to trimethylsilane (3 MS), triethylsilane, pentamethyl disilamethane (($CH_3$)$_2$Si—$CH_2$—Si($CH_3$)$_3$), and dimethylsilane (2 MS).

Third, the silicon-containing precursor can be an alkoxy silane. The alkoxy silanes include a central silicon atom with one or more alkoxy groups bonded to it and one or more hydrogen atoms bonded to it. Examples include but are not limited to trimethoxysilane (TMOS), dimethoxysilane (DMOS), methoxysilane (MOS), methyldimethoxysilane (MDMOS), diethyoxymethylsilane (DEMS), dimethylethoxysilane (DMES), and dimethylmethoxysilane (DMMOS).

Additionally, disilanes, trisilanes, or other higher silanes may be used in place of monosilanes. In some embodiments, one of the silicon atoms can have a carbon-containing or hydrocarbon-containing group attached to it, and one of the silicon atoms can have a hydrogen atom attached to it.

In depositing oxygen doped silicon carbide, multiple silicon-containing precursors can be present in the process gas. For example, a siloxane and an alkyl silane may be used together, or a siloxane and an alkoxy silane may be used together. The relative proportions of the individual precursors can be chosen based on the chemical structures of precursors chosen and the application of the resulting oxygen doped silicon carbide film. For example, the amount of siloxane can be greater than the amount of silane in molar percentages to produce a porous film as discussed in more detail below.

For depositing oxygen doped silicon carbide films, examples of suitable precursors include cyclic siloxanes such as cyclotetrasiloxanes such as heptamethylcyclotetrasiloxane (HMCTS) and tetramethylcyclotetrasiloxane (TMCTS). Other cyclic siloxanes can also include but are not limited to cyclotrisiloxanes and cyclopentasiloxanes. For depositing oxygen doped silicon carbide films, other examples of suitable precursors include linear siloxanes such as but not limited to disiloxanes, such as pentamethyldisiloxane (PMDSO), tetramethyldisiloxane (TMDSO), hexamethyl trisiloxane, and heptamethyl trisiloxane.

As explained, silicon-containing precursors are chosen to provide highly conformal silicon carbide films. It is believed that silicon-containing precursors having low sticking coefficients are capable of producing highly conformal films. "Sticking coefficient" is a term used to describe the ratio of the number of adsorbate species (e.g., fragments or molecules) that adsorb/stick to a surface compared to the total number of species that impinge upon that surface during the same period of time. The symbol $S_c$ is sometimes used to refer to the sticking coefficient. The value of $S_c$ is between 0 (meaning that none of the species stick) and 1 (meaning that all of the impinging species stick). Various factors affect the sticking coefficient including the type of impinging species, surface temperature, surface coverage, structural details of the surface, and the kinetic energy of the impinging species. Certain species are inherently more "sticky" than others, making them more likely to adsorb onto a surface each time the species impinges on the surface. These more sticky species have greater sticking coefficients (all other factors being equal), and are more likely to adsorb near the entrance of a recessed feature compared to less sticky species having lower sticking coefficients. In some cases, the sticking coefficient of the precursors (at the relevant deposition conditions) may be about 0.05 or less, for example about 0.001 or less.

Structure and Properties of the Deposited Film

The deposited film will include silicon, oxygen, and carbon. In some embodiments, the atomic concentration of silicon is between about 15% and 45%, the atomic concentration of oxygen is between about 10% and 40%, and the atomic concentration of carbon is between about 30% and 60%. In one example, the atomic concentration of silicon is about 30%, the atomic concentration of oxygen is about 25%, and the atomic concentration of carbon is about 45%. It will be understood that the relative atomic concentrations can vary depending on the choice of the precursor. The silicon atoms will form bonds with carbon and/or oxygen atoms. In some embodiments, the deposited film contains more Si—O bonds than Si—C bonds. This can provide a relatively porous film with a lower dielectric constant. In some examples, the deposited film contains a ratio of Si—O bonds to Si—C bonds that is between about 0.5:1 and 3:1.

In some embodiments, the internal structure of the precursor is maintained in the deposited film. This structure may preserve all or most of the Si—C and Si—O bonds in the precursor, while linking or cross-linking individual precursor moieties through bonds at locations where Si—H bonds and/or Si—Si bonds existed in the precursor molecules and/or through additional condensation reactions on the growing surface if sufficient thermal energy is provided.

The process conditions described earlier can provide a film structure that is highly conformal. The relatively mild process conditions can minimize the degree of ion bombardment at the surface of the substrate so that the deposition lacks directionality. Moreover, the relatively mild process conditions can reduce the number of radicals with high sticking coefficients that would have a tendency to stick to the sidewalls of previously deposited layers or films. In certain embodiments, for aspect ratios of about 2:1 to 10:1, the oxygen doped silicon carbide film can be deposited with a conformality of between about 25% and 100%, more typically between about 50% and 100%, and even more typically between about 80% and 100%. Conformality may be calculated by comparing the average thickness of a deposited film on a bottom, sidewall, or top of a feature to the average thickness of a deposited film on a bottom, sidewall, or top of a feature. For example, conformality may be calculated by dividing the average thickness of the deposited film on the sidewall by the average thickness of the deposited film at the top of the feature and multiplying it by 100 to obtain a percentage. For certain applications, a conformality of between about 85% and 95% is sufficient. In some examples depositing silicon carbide on features having an aspect ratio of between about 2:1 and about 4:1, the conformality is at least about 90%. Certain BEOL (back end of line) processes fall into this category. In some examples depositing silicon carbide on features having an aspect ratio of between about 4:1 and about 6:1, the conformality is at least about 80%. Certain spacer deposition processes fall into this category. In some examples depositing silicon carbide on features having an aspect ratio of between about 7:1 and about 10:1 (and even higher), the conformality is at least about 90%. Certain DRAM (dynamic random access memory) fabrication processes fall into this category.

The process conditions can also provide a film structure with a high breakdown voltage and a low leakage current. By introducing a limited amount of oxygen into a SiC class of material, leakage paths provided by Si—H bonds and/or Si—$CH_2$—Si bonds may be blocked by oxygen. This can provide improved electrical properties while maintaining a relatively low dielectric constant. In various embodiments, the film has an effective dielectric constant of about 4.5 or lower, about 4.0 or lower, about 3.5 or lower, and in some implementations about 3.0 or lower, and in still other implementations about 2.5 or lower. The effective dielectric constant can depend on the bonding and density. In some embodiments, where applications demand a relatively high dielectric constant, the oxygen doped silicon carbide film can have an effective dielectric constant greater than about 4.0 to provide a relatively dense, highly cross-linked oxygen doped silicon carbide film. In some embodiments, the oxygen doped silicon carbide film can be relatively thin and yet serve as a hermetic or diffusion barrier.

In some embodiments, the deposited film can be porous. As discussed earlier herein, the silicon-containing precursors can include cyclic siloxanes and caged siloxanes. These precursors, and others that have significant interior open space, can introduce significant porosity into the structure of the deposited film. Porosity in the deposited film can further lower the dielectric constant. In some embodiments, the porosity of the deposited oxygen doped silicon carbide film is between about 20% and 50%. The pore size of porous film may track that of the cyclic or caged precursor. In certain embodiments, the film's average pore size is between about 5 Å and 20 Å, such as about 16 Å.

Figure 4A:
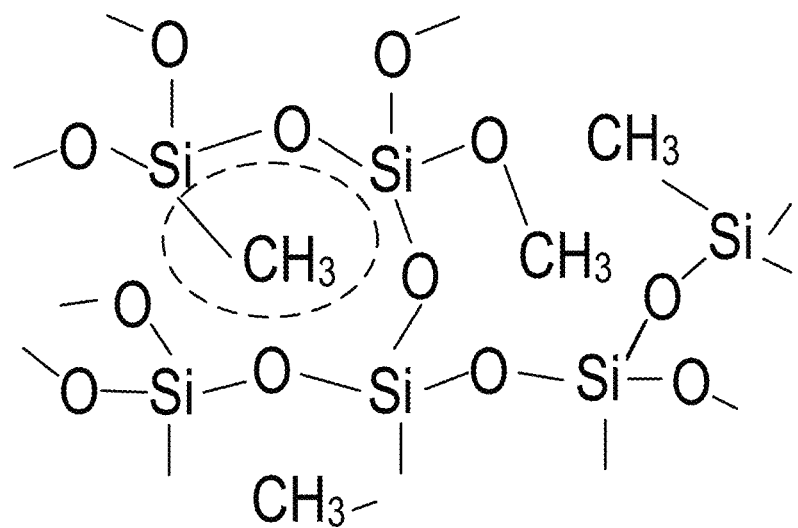
FIG. 4A illustrates a chemical structure of an example conventional silicon oxycarbide or carbon doped silicon oxide (SiOC or SiOC:H).
Figure 4B:
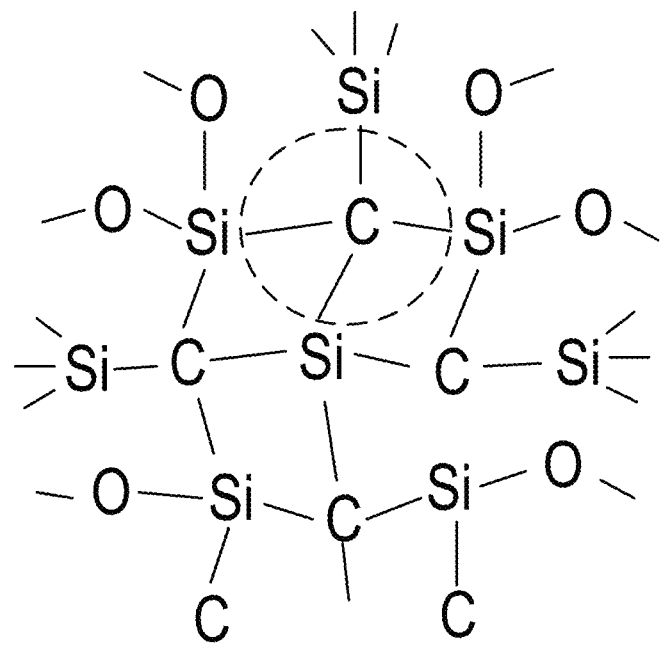
FIG. 4B illustrates a chemical structure of an example oxygen doped silicon carbide (SiCO).

The oxygen doped silicon carbide film deposited by the method of the present disclosure can have a chemical structure that is distinguishable from conventional SiOC films. While the oxygen doped silicon carbide film deposited by the method of the present disclosure can be referred to as an SiOC film or an SiCO film, it will be understood that a conventional SiOC film does not have the same chemical structure or properties as an SiOC or SiCO film deposited by the method of the present disclosure. In some embodiments, a conventional SiOC film can be a carbon doped silicon oxide film that is distinguishable from SiOC or SiCO films of the present disclosure. FIG. 4A shows an example chemical structure of a conventional SiOC film. FIG. 4B shows an example of a chemical structure of an oxygen doped silicon carbide (SiOC or SiCO) film deposited by the method of the present disclosure.

Many conventional deposition techniques form conventional SiOC or SiOC:H with a chemical structure similar to what is shown in FIG. 4A. For example, such SiOC or SiOC:H films are formed by doping a silicon dioxide ($SiO_2$) film with carbon. As shown in FIG. 4A, such SiOC or SiOC:H films include multiple terminal $CH_3$ bonds, where carbon atoms are coordinated by oxygen and hydrogen atoms. The carbon atoms, or at least a substantial fraction of the carbon atoms, are not cross-linked. In addition, the SiOC or SiOC:H films in FIG. 4A have a relatively high hydrogen content. A carbon doped silicon oxide structure as shown in FIG. 4A may possess different properties than an oxygen doped silicon carbide structure of the present disclosure as shown in FIG. 4B.

The method of the present disclosure produces oxygen doped silicon carbide (SiOC or SiCO) films with a chemical structure similar to what is shown in FIG. 4B. For example, such oxygen doped silicon carbide films may be formed by one or more radical species (e.g., hydrogen radicals) in a substantially low energy state (e.g., ground state) that react with silicon-containing precursors, where the one or more radical species are produced from a remote plasma source. As shown in FIG. 4B, the oxygen doped silicon carbide films include little to no terminal $CH_3$ bonds, where carbon atoms are generally cross-linked and coordinated by silicon atoms. The carbon atoms, or at least a substantial fraction of the carbon atoms, are cross-linked and not coordinated by hydrogen or oxygen atoms. In addition, the oxygen doped silicon carbide films in FIG. 4B have a relatively low hydrogen content.

Properties of deposited oxygen doped silicon carbide films can be compared to properties of carbon doped silicon oxide films or conventional SiOC films. Conventional SiOC or SiOC:H films with a structure similar to what is shown in FIG. 4A can readily hydrolyze and with relatively low energy. For example, Si—O—$CH_3$ can readily hydrolyze into Si—OH and HO—CH$_3$. Where silicon atoms are coordinated by oxygen atoms in FIG. 4A, the polarity of the Si—O bonds causes the film to be more vulnerable to fluorination and subsequent dissociation during etch processes, such as HF wet etch processes. The higher polarity of Si—O bonds relative to Si—C bonds increases reactivity towards acids. However, oxygen doped silicon carbide films with a structure similar to what is shown in FIG. 4B does not readily hydrolyze, but the reaction is slow and requires high energy. For example Si—C—Si does not readily hydrolyze. Where carbon atoms are coordinated by silicon atoms in FIG. 4B, the polarity of Si—C bonds causes the film to be less vulnerable to fluorination and subsequent dissociation during etch processes, such as HF wet etch processes. The relative non-polarity of Si—C bonds compared to Si—O bonds enables the oxygen doped silicon carbide film to be more inert with respect to acids. Accordingly, in some embodiments, the oxygen doped silicon carbide film may have greater wet etch resistance than carbon doped silicon oxide.

Figure 5A:
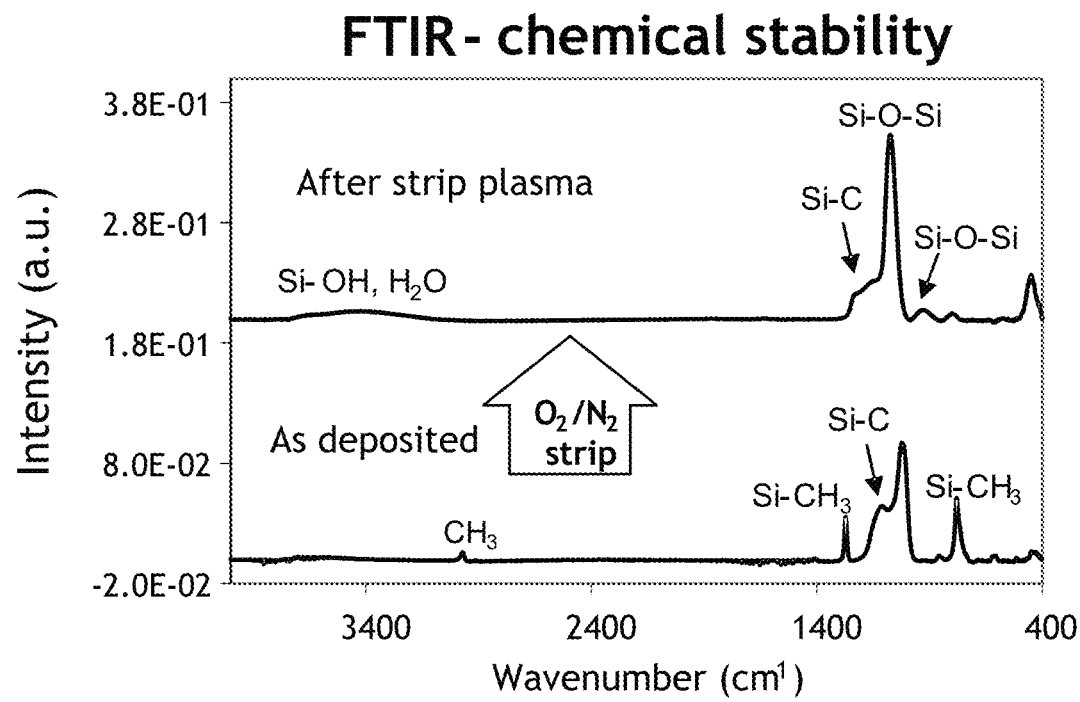
FIG. 5A illustrates a Fourier Transform Infrared Spectroscopy (FTIR) plot of chemical stability of an example conventional silicon oxycarbide or carbon doped silicon oxide (SiOC or SiOC:H).

FIG. 5A illustrates a Fourier Transform Infrared Spectroscopy (FTIR) plot of chemical stability of a conventional SiOC or SiOC:H film. The FTIR plot shows that the film contains Si—CH$_3$ bonds, Si—C bonds, and Si—O—Si bonds upon deposition. After exposure to an etch process, such as an O$_2$/N$_2$ strip process, the Si—CH$_3$ bonds largely disappear. The terminal CH$_3$ bonds may be readily removed so that the after the O$_2$/N$_2$ strip process, only Si—C bonds and Si—O—Si bonds largely remain. This shows that the example conventional SiOC or SiOC:H film is not chemically stable, particularly when exposed to an etch process.

Figure 5B:
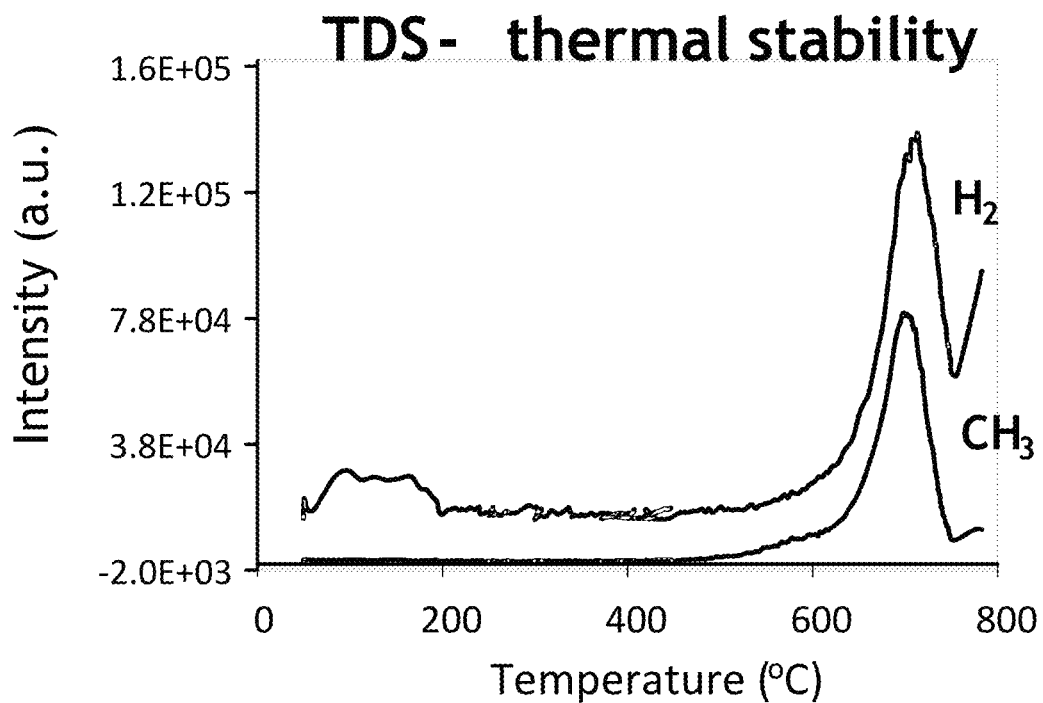
FIG. 5B illustrates a thermal desorption spectroscopy (TDS) plot of thermal stability of an example conventional silicon oxycarbide or carbon doped silicon oxide (SiOC or SiOC:H).

FIG. 5B illustrates a thermal desorption spectroscopy (TDS) plot of thermal stability of a conventional SiOC or SiOC:H film. The TDS plot shows that at higher temperatures, such as temperatures greater than 600° C., molecules of CH$_3$ and H$_2$ desorb from the substrate surface. Terminal CH$_3$ bonds may be broken down easily at elevated temperatures, and more hydrogen will desorb from the conventional SiOC or SiOC:H film having increased hydrogen content. This shows that a conventional SiOC or SiOC:H film is not thermally stable, particularly when exposed to elevated temperatures.

Figure 6A:
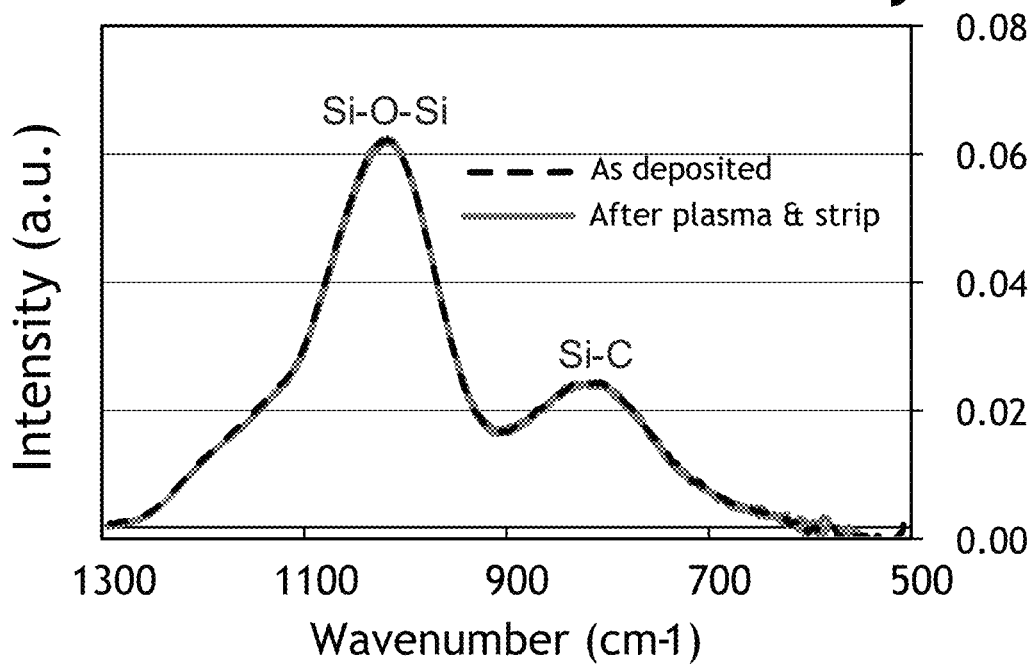
FIG. 6A illustrates an FTIR plot of chemical stability of an example oxygen doped silicon carbide (SiCO).

FIG. 6A illustrates an FTIR plot of chemical stability of an oxygen doped silicon carbide (SiOC or SiCO) film deposited by the method of the present disclosure. The FTIR plot shows that the film contains Si—O—Si bonds and Si—C bonds, but no Si—CH$_3$ bonds. After exposure to an etch process, such as an O$_2$/N$_2$ strip process, the FTIR plot remains the same. This shows that the example oxygen doped silicon carbide film is chemically stable, particularly when exposed to an etch process.

Figure 6B:
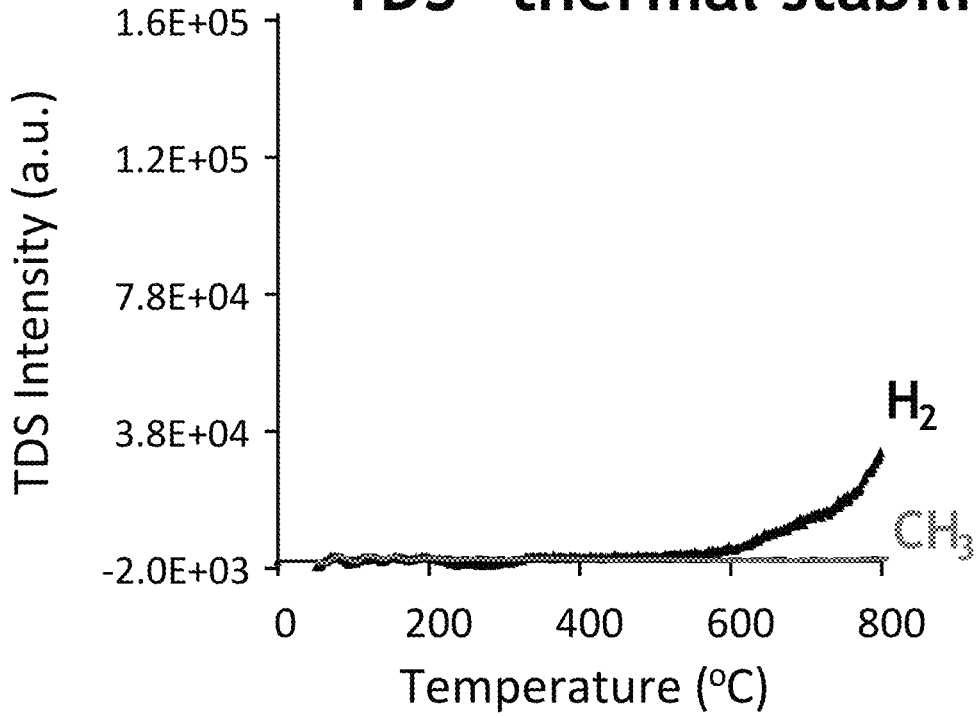
FIG. 6B illustrates a TDS plot of thermal stability of an example oxygen doped silicon carbide (SiCO).

FIG. 6B illustrates a TDS plot of thermal stability of an oxygen doped silicon carbide film deposited by the method of the present disclosure. The TDS plot shows that at higher temperatures, such as temperatures greater than 600° C., molecules of CH$_3$ do not desorb from the substrate surface. Further, fewer molecules of H$_2$ desorb from the substrate surface in FIG. 6B compared to FIG. 5B. This shows that an oxygen doped silicon carbide film deposited by the method of the present disclosure is thermally stable.

Therefore, the oxygen doped silicon carbide film can have a low etch rate, can be thermally stable, and can be chemically stable. This allows the film to tolerate high temperature anneals, dry/wet etching, ashing, and other fabrication processes. Without being limited by any theory, this robustness can be due in part to the cross-linked Si—C bonding and lack of CH$_3$ terminal bonds. This kind of film can offer significant performance improvements in semiconductor applications, such as low-k spacer applications.

Oxygen doped silicon carbide films may provide improved properties compared to other conventional dielectric materials, including SiOC/SiOC:H, SiO$_2$, and SiBCN. Not only can an oxygen doped silicon carbide film provide a low-k dielectric, but the oxygen doped silicon carbide film can provide high breakdown voltages, high chemical stability, high thermal stability, and strong resistance to wet etching. Such oxygen doped silicon carbide films may be useful in low-k spacer applications that require an integration flow involving various thermal annealing and etching steps, where the oxygen doped silicon carbide film can survive the integration flow while maintaining low-k. Conventional SiOC/SiOC:H, SiO$_2$, and SiBCN films may offer low-k but may not survive such an integration flow.

Apparatus

One aspect of the disclosure is an apparatus configured to accomplish the methods described herein. A suitable apparatus includes hardware for accomplishing the process operations and a system controller having instructions for controlling process operations in accordance with the present disclosure. In some embodiments, the apparatus for performing the aforementioned process operations can include a remote plasma source. A remote plasma source provides mild reaction conditions in comparison to a direct plasma source. An example of a suitable remote plasma apparatus is described in U.S. patent application Ser. No. 14/062,648, filed Oct. 24, 2013, which is incorporated herein by reference in its entirety.

Figure 3:
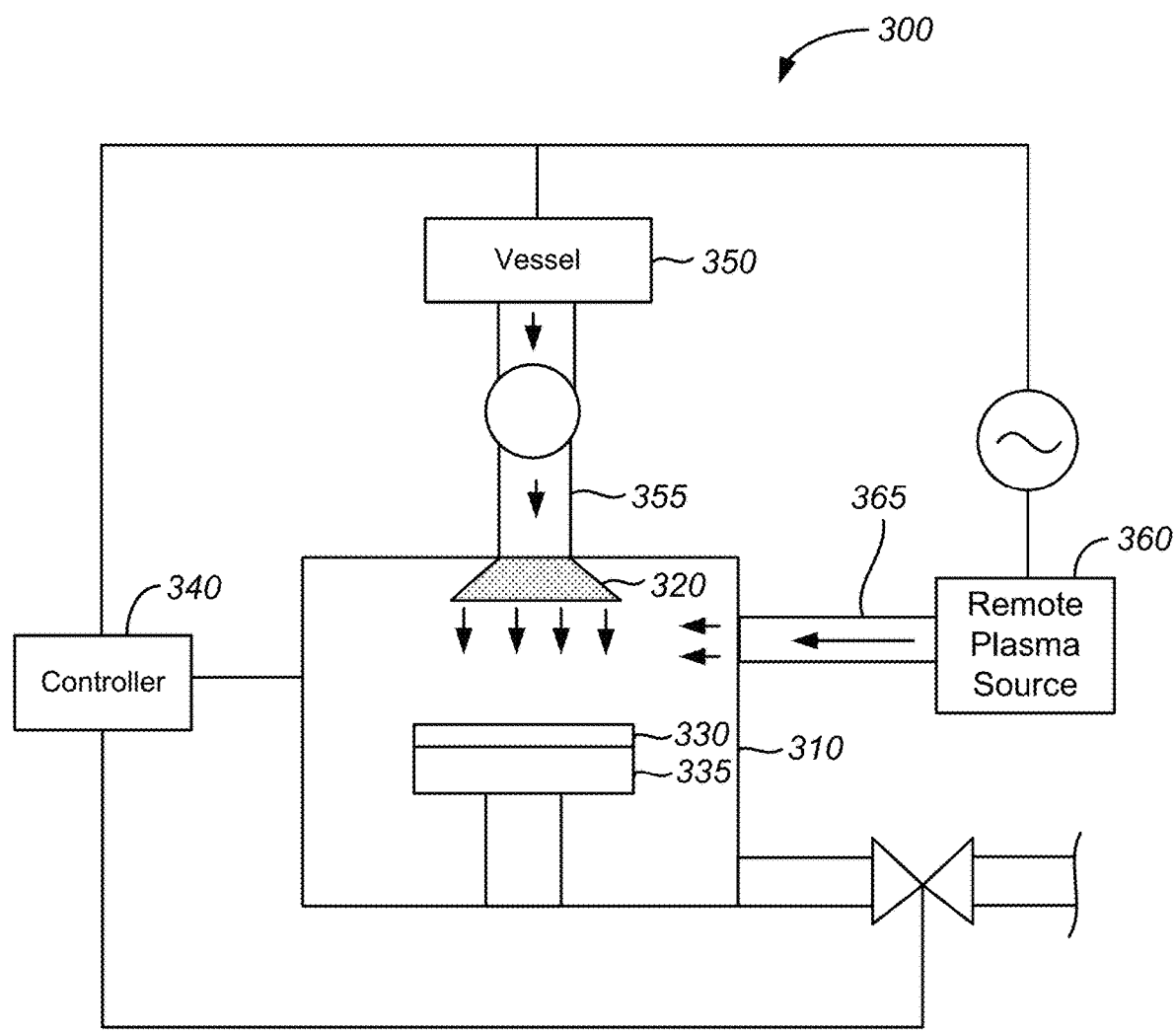
FIG. 3 illustrates a schematic view of a processing apparatus with a remote plasma source.

FIG. 3 presents a schematic diagram of a remote plasma apparatus according to certain embodiments. The device 300 includes a reaction chamber 310 with a showerhead assembly 320. Inside the reaction chamber 310, a substrate 330 rests on a stage or pedestal 335. In some embodiments, the pedestal 335 can be fitted with a heating/cooling element. A controller 340 may be connected to the components of the device 300 to control the operation of the device 300. For example, the controller 340 may contain instructions or controlling process conditions for the operations of the device 300, such as the temperature process conditions and/or the pressure process conditions.

During operation, gases or gas mixtures are introduced into the reaction chamber 310 via one or more gas inlets coupled to the reaction chamber 310. In some embodiments, two or more gas inlets are coupled to the reaction chamber 310. A first gas inlet 355 can be coupled to the reaction chamber 310 and connected to a vessel 350, and a second gas inlet 365 can be coupled to the reaction chamber 310 and connected to a remote plasma source 360. In embodiments including remote plasma configurations, the delivery lines for the precursors and the radical species generated in the remote plasma source are separated. Hence, the precursors and the radical species do not substantially interact before reaching the substrate 330.

One or more radical species may be generated in the remote plasma source 360 and configured to enter the reaction chamber 310 via the gas inlet 365. Any type of plasma source may be used in remote plasma source 360 to create the radical species. This includes, but is not limited to, capacitively coupled plasmas, inductively coupled plasmas, microwave plasmas, DC plasmas, and laser-created plasmas. An example of a capacitively coupled plasma can be a radio frequency (RF) plasma. A high-frequency plasma can be configured to operate at 13.56 MHz or higher. An example of such a remote plasma source 360 can be the GAMMA®, manufactured by Novellus Systems of San Jose, Calif.

Another example of such a RF remote plasma source 360 can be the Astron®, manufactured by MKS Instruments of Wilmington, Mass., which can be operated at 440 kHz and can be provided as a subunit bolted onto a larger apparatus for processing one or more substrates in parallel. In some embodiments, a microwave plasma can be used as the remote plasma source 360, such as the Astex®, also manufactured by MKS Instruments. A microwave plasma can be configured to operate at a frequency of 2.45 GHz.

The precursors can be provided in vessel 350 and can be supplied to the showerhead 320 via the first gas inlet 355. The showerhead 320 distributes the precursors into the reaction chamber 310 toward the substrate 330. The substrate 330 can be located beneath the showerhead 320. It will be appreciated that the showerhead 320 can have any suitable shape, and may have any number and arrangement of ports for distributing gases to the substrate 330. The precursors can be supplied to the showerhead 320 and ultimately to the substrate 330 at a controlled flow rate.

The one or more radical species formed in the remote plasma source 360 can be carried in the gas phase toward the substrate 330. The one or more radical species can flow through a second gas inlet 365 into the reaction chamber 310. It will be understood that the second gas inlet 365 need not be transverse to the surface of the substrate 330 as illustrated in FIG. 3. In certain embodiments, the second gas inlet 365 can be directly above the substrate 330 or in other locations. The distance between the remote plasma source 360 and the reaction chamber 310 can be configured to provide mild reactive conditions such that the ionized species generated in the remote plasma source 360 are substantially neutralized, but at least some radical species in substantially low energy states remain in the environment adjacent to the substrate 330. Such low energy state radical species are not recombined to form stable compounds. The distance between the remote plasma source 360 and the reaction chamber 310 can be a function of the aggressiveness of the plasma (e.g., determined in part by the source RF power level), the density of gas in the plasma (e.g., if there's a high concentration of hydrogen atoms, a significant fraction of them may recombine to form $H_2$ before reaching the reaction chamber 310), and other factors. In some embodiments, the distance between the remote plasma source 360 and the reaction chamber 310 can be between about 10 cm and 50 cm, such as about 30 cm.

In some embodiments, a co-reactant, which is not the primary silicon-containing precursor or a hydrogen radical, may be introduced during the deposition reaction. In some implementations, the apparatus is configured to introduce the co-reactant through the second gas inlet 365, in which case the co-reactant is at least partially converted to plasma. In some implementations, the apparatus is configured to introduce the co-reactant through the showerhead 320 via the first gas inlet 355. Examples of the co-reactant include oxygen, nitrogen, carbon dioxide, and the like.

The controller 340 may contain instructions for controlling process conditions for the operation of the device 300. The controller 340 will typically include one or more memory devices and one or more processors. The processor may include a CPU or computer, analog and/or digital input/output connections, stepper motor controller boards, etc. Instructions for implementing appropriate control operations are executed on the processor. These instructions may be stored on the memory devices associated with the controller 340 or they may be provided over a network.

In certain embodiments, the controller 340 controls all or most activities of the semiconductor processing device 300 described herein. For example, the controller 340 may control all or most activities of the semiconductor processing device 300 associated with depositing oxygen doped silicon carbide film and, optionally, other operations in a fabrication flow that includes the oxygen doped silicon carbide film. The controller 340 may execute system control software including sets of instructions for controlling the timing, gas composition, gas density, gas flow rates, chamber pressure, chamber temperature, RF power levels, substrate position, and/or other parameters. Other computer programs, scripts, or routines stored on memory devices associated with the controller 340 may be employed in some embodiments. To provide relatively mild reactive conditions at the environment adjacent to the substrate 330, parameters such as the RF power levels, gas flow rates to the remote plasma region, and timing of the plasma ignition can be adjusted and maintained by controller 340. Additionally, adjusting the substrate position may further reduce the presence of high-energy radical species at the environment adjacent to the substrate 330.

In a multi-station reactor, the controller 340 may comprise different or identical instructions for different apparatus stations, thus allowing the apparatus stations to operate either independently or synchronously.

In some embodiments, the controller 340 may include instructions for performing operations such as flowing a silicon-containing precursor through the first gas inlet 355 into the reaction chamber 310, providing the one or more radical species in a substantially low energy state from the remote plasma source 360, and flowing the one or more radical species through the second gas inlet 365 into the reaction chamber 310 to react with the silicon-containing precursor to form the oxygen doped silicon carbide film on the substrate 330.

In some embodiments, the apparatus may include a user interface associated with controller 340. The user interface may include a display screen, graphical software displays of the apparatus and/or process conditions, and user input devices such as pointing devices, keyboards, touch screens, microphones, etc.

The computer program code for controlling the above operations can be written in any conventional computer readable programming language: for example, assembly language, C, C++, Pascal, Fortran, or others. Compiled object code or script is executed by the processor to perform the tasks identified in the program.

Signals for monitoring the process may be provided by analog and/or digital input connections of the system controller. The signals for controlling the process are output on the analog and digital output connections of the processing system.

In general, the methods described herein can be performed on systems including semiconductor processing equipment such as a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. In general, the electronics are referred to as the controller, which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials (e.g., silicon carbide), surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

In addition to the oxygen doped silicon carbide deposition described herein, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

Applications

The present disclosure may be further understood by reference to the following applications for high-quality oxygen doped silicon carbide (SiOC or SiCO) films, which applications are intended to be purely exemplary. The present disclosure is not limited in scope by the specified applications, which are simply illustrations of aspects of the present disclosure.

In some embodiments, an oxygen doped silicon carbide film may be deposited over exposed copper. In some embodiments in depositing the oxygen doped silicon carbide film, reaction conditions adjacent to the substrate can be free of oxidants, such as $O_2$, $O_3$, and $CO_2$, including radicals thereof. Thus, the oxygen doped silicon carbide film may be deposited directly over the exposed copper without oxidizing copper (e.g., creating cupric oxide). Such films can serve as etch stop layers, which can also serve as copper diffusion barriers. The presence of the oxygen doped silicon carbide film can provide a sufficiently low dielectric constant with excellent leakage properties to serve as a diffusion barrier. The oxygen doped silicon carbide film can be an etch stop and/or diffusion barrier either by itself or as a bilayer stack (e.g., SiCO/SiNC bilayer deposited over exposed copper). In some embodiments, the oxygen doped silicon carbide film can be placed in between adjacent metallization layers that are typically produced by a damascene process. The oxygen doped silicon carbide film can resist etching and can be sufficiently dense to minimize the diffusion of copper ions into adjacent regions of dielectric material. In some embodiments, the precursor employed for the oxygen doped silicon carbide film can be non-cyclic. Non-cyclic precursors can include PMDSO or TMDSO. The non-cyclic precursor can provide a sufficiently high density to serve as a hermetic or diffusion barrier. In some embodiments, nitrogen may be incorporated into the film by employing nitrogen-containing precursors or plasma activating nitrogen-containing radicals, such as elemental nitrogen radicals or amine radicals.

In some embodiments, an oxygen doped silicon carbide film may be deposited as vertical structures adjacent to metal or semiconductor structures. Deposition of oxygen doped silicon carbide provides excellent step coverage along sidewalls of the metal or semiconductor structures to create the vertical structures. In certain embodiments, the vertical structures may be referred to as spacers or liners. FIG. 1B illustrates a cross-section of oxygen doped silicon carbide liners deposited on the sidewalls of a gate electrode structure of a transistor. As illustrated in FIG. 1B, the transistor can be a CMOS transistor with a silicon substrate 110 having a source 112 and a drain 113. A gate dielectric 114 can be deposited over the silicon substrate 110, and a gate electrode can be deposited over the gate dielectric 115 to form the transistor. Oxygen doped silicon carbide spacers or liners 111 can be deposited on the sidewalls of the gate electrode 115 and gate dielectric 114. In another example, FIG. 1C illustrates a cross-section of oxygen doped silicon carbide deposited on sidewalls of exposed copper lines in an air gap type metallization layer. Air gaps 120 can be introduced into an integrated circuit layer between copper lines 122 that can reduce the effective k-value of the layer. Oxygen doped silicon carbide liners 121 can be deposited on the sidewalls of the copper lines 122, and a nonconformal dielectric layer 123 can be deposited the air gaps 120, liners 121, and copper lines 122. Examples of such air gap type metallization layers can be described in U.S. Patent Application Publication No. 2004/0232552 to Fei Wang et al., which is herein incorporated by reference in its entirety and for all purposes.

In some embodiments, an oxygen doped silicon carbide film may be deposited on the sidewalls of patterned porous dielectric materials. Ultra low-k dielectric materials can be made from a porous structure. The pores in such materials can provide areas for ingress of metal during deposition of subsequent layers, including the deposition of diffusion barriers containing a metal such as tantalum (Ta). If too much metal migrates into the dielectric material, the dielectric material may provide a short circuit between adjacent copper metallization lines. FIG. 1D illustrates a cross-section of oxygen doped silicon carbide as a pore sealant for porous dielectric materials. A porous dielectric layer 132 can have a plurality of trenches or vias cut into the porous dielectric layer 132 to form pores 130. Oxygen doped silicon carbide 131 can be deposited along the pores 130 to effectively seal the pores 130. Sealing the pores 130 with the oxygen doped silicon carbide 131 can avoid damaging the porous dielectric layer 132 that may otherwise be incurred by other sealing techniques using a plasma. The oxygen doped silicon carbide 131 can be sufficiently dense as a pore sealant and may include non-cyclic silicon-containing precursors, such as PMDSO and TMDSO. In some embodiments, an etched dielectric material such as the porous dielectric layer 132 may first be treated by a "k-recovery" process, which exposes the porous dielectric layer 132 to UV radiation and a reducing agent. This recovery process is further described in commonly owned U.S. Patent Application Publication No. 2011/0111533 to Varadarajan et al., which is incorporated by reference herein in its entirety and for all purposes. In another "k-recovery" process, the porous dielectric layer 132 can be exposed to UV radiation and a chemical silylating agent. This recovery process is further described in commonly owned U.S. Patent Application Publication No. 2011/0117678 to Varadarajan et al., which is incorporated by reference herein in its entirety and for all purposes. After exposing the pores 130 to the recovery treatment, which makes the surface more hydrophilic and provides a monolayer of material, a layer of conformally deposited oxygen doped silicon carbide 131 can be deposited to effectively seal the pores of the porous dielectric layer 132.

In some embodiments, an oxygen doped silicon carbide film may be deposited as an ultra low-k dielectric material itself. Ultra low-k dielectrics are conventionally defined as those materials that have a dielectric constant lower than that of 2.5. In such configurations, the ultra low-k dielectric material of oxygen doped silicon carbide can be a porous dielectric layer. The pores of the dielectric layer can be introduced by using cyclic or caged precursor molecules, including the cyclic siloxanes and silsesquioxanes. In one example, the porosity of the ultra low-k dielectric layer of oxygen doped silicon carbide can be between about 20% and 50%. Further, the ultra low-k dielectric layer can have an average pore size of less than about 100 Å, such as between about 5 Å and 20 Å. For example, a cyclosiloxane ring can have a radius of about 6.7 Å. While increasing the number and size of the pores can lower the dielectric constant, the mechanical integrity of the dielectric layer can be compromised if it is too porous.

In some embodiments, an oxygen doped silicon carbide film 151 may be deposited as a sidewall spacer in a fin field-effect transistor (finFET) structure. With technology nodes shrinking and pitches getting smaller and smaller in electronic devices, conductive features are positioned closer and closer. Separation between such conductive features is becoming smaller, which can lead to parasitic capacitances increasing. Parasitic capacitances may cause delay in transmission signals, such as from a transistor to an interconnect line. Rather than increasing a thickness of a dielectric material between conductive features, a material with low dielectric constant can limit parasitic capacitances especially as technology nodes shrink.

Silicon nitride ($Si_3N_4$) as a sidewall spacer may offer good step coverage, thermal stability, chemical stability, chemical selectivity, and high breakdown voltages. However, a dielectric constant of silicon nitride may be unsuitably high for many electronic devices. Silicon dioxide ($SiO_2$) films may possess a lower dielectric constant sufficient for many electronic devices, but may not have a sufficient wet etch resistance to survive a typical integration flow. Doping $SiO_2$ films with carbon or nitrogen atoms may improve its resistance to wet etch processes, but may still result in poor thermal stability and chemical stability. Oxygen doped silicon carbide (SiCO) films may offer sufficiently low dielectric constants with improved resistance to wet etching processes, thermal stability, chemical stability, high breakdown voltages, excellent chemical selectivity, and good step coverage. Such oxygen doped silicon carbide films may maintain a low dielectric constant and survive an integration flow involving various thermal annealing and etching steps.

FIG. 1E illustrates three-dimensional schematic representations in an example integration flow for manufacturing finFET structures. A finFET structure may include multiple gate electrodes (e.g., polysilicon) in parallel with one another and multiple "fins" of thin semiconductor material in parallel with one another and extending perpendicularly from both sides of the gate electrodes. Fins extending from one side of a gate electrode may correspond to source regions while fins extending from the opposite side of the gate electrode may correspond to drain regions. Each top of the gate electrodes may be covered with a gate mask. An oxygen doped silicon carbide sidewall spacer 151 may be conformally deposited on sidewalls of the fins and of the gate electrodes as well as over the gate mask and top surfaces of the fins. A spacer etch may remove portions of the oxygen doped silicon carbide sidewall spacer 151 from the fins and from the gate mask of the gate electrode. An NMOS epitaxial growth step may form source/drain areas on the fins. Dielectric material may fill the finFET structure with an etch stop and/or pre-metal dielectric. Gate electrodes may undergo lithographic processing steps for gate cutting and metal filling. Such processing steps may involve one or more etch processes, wet clean processes, and photoresist stripping processes. The oxygen doped silicon carbide sidewall spacer 151 may be stable through such processing steps. Gate electrodes may further undergo contact or self-aligned contact (SAC) etch steps, which may require selectivity, plasma resistance, and wet clean resistance in the oxygen doped silicon carbide sidewall spacer 151.

Although the foregoing has been described in some detail for purposes of clarity and understanding, it will be apparent that certain changes and modifications may be practiced within the scope of the appended claims. It should be noted that there are many alternative ways of implementing the processes, systems, and apparatus described. Accordingly, the described embodiments are to be considered as illustrative and not restrictive.

What is claimed is:

1. A method of depositing oxygen doped silicon carbide (SiCO) film, the method comprising:
   providing a substrate;
   flowing one or more silicon-containing precursors onto the substrate, wherein each of the one or more silicon-containing precursors has (i) one or more silicon-hydrogen bonds and/or silicon-silicon bonds and (ii) one or more silicon-oxygen bonds and one or more silicon-carbon bonds;
   flowing a source gas into a remote plasma source;
   generating, from the source gas, radicals of hydrogen in the remote plasma source; and
   introducing the radicals of hydrogen onto the substrate, wherein at least 90% of the radicals are radicals of hydrogen in a ground state that react with the one or more silicon-containing precursor to form SiCO film on the substrate under conditions that break one or both of silicon-hydrogen bonds and silicon-silicon bonds but preserve the silicon-oxygen bonds and the silicon-carbon bonds, wherein the SiCO film has an effective dielectric constant greater than 4.0, wherein the SiCO film is deposited at an operating temperature between 250° C. and 400° C.

2. The method of claim 1, wherein the silicon-containing precursors include cyclic siloxanes.

3. The method of claim 2, wherein the siloxanes are selected from the group consisting of TMCTS, OMCTS, and HMCTS.

4. The method of claim 2, wherein the cyclic siloxanes are caged siloxanes.

5. The method of claim 1, wherein the silicon-containing precursors include alkoxy silanes.

6. The method of claim 1, wherein the silicon-containing precursors include alkyl silanes.

7. The method of claim 1, wherein at least some of a plurality of carbon atoms in the SiCO film are cross-linked.

8. The method of claim 1, wherein a thermal desorption spectroscopy (TDS) plot associated with the SiCO film contains no peak for desorption of $H_2$ and desorption of $CH_3$ at temperatures greater than 600° C.

9. The method of claim 1, wherein a Fourier Transform Infrared Spectroscopy (FTIR) plot associated with the SiCO film contains no peak for Si—$CH_3$ bonding.

10. The method of claim 1, wherein the ratio of silicon-oxygen bonds to silicon-carbon bonds in the SiCO film is between 0.5:1 and 3:1.

11. The method of claim 1, wherein the SiCO film is deposited in a plurality of features of the substrate, wherein the SiCO film has a conformality of at least 90%.

12. The method of claim 1, wherein the substrate comprises a transistor having a gate electrode, the method further comprising forming the SiCO film on one or more sidewalls of the gate electrode.

* * * * *